(12) United States Patent
Shiraishi et al.

(10) Patent No.: US 7,005,216 B2
(45) Date of Patent: Feb. 28, 2006

(54) PHOTO MASK

(75) Inventors: Hiroshi Shiraishi, Hachioji (JP); Sonoko Migitaka, Kodaira (JP); Takashi Hattori, Musashimurayama (JP); Tadashi Arai, Kumagaya (JP); Toshio Sakamizu, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 198 days.

(21) Appl. No.: 10/299,692

(22) Filed: Nov. 20, 2002

(65) Prior Publication Data
US 2003/0129505 A1    Jul. 10, 2003

(30) Foreign Application Priority Data
Dec. 28, 2001    (JP)    ............................. 2001-400619

(51) Int. Cl.
*G03F 9/00*    (2006.01)

(52) U.S. Cl. ............................................. 430/5

(58) Field of Classification Search ............... 430/5
See application file for complete search history.

(56) References Cited

U.S. PATENT DOCUMENTS
6,653,052 B1 *  11/2003  Tanaka et al. ............... 430/311

FOREIGN PATENT DOCUMENTS
JP    04-136854    5/1992
JP    05-289307    11/1993

* cited by examiner

*Primary Examiner*—Saleha R. Mohamedulla
(74) *Attorney, Agent, or Firm*—Antonelli, Terry, Stout and Kraus, LLP.

(57) ABSTRACT

Providing a photo mask for KrF excimer laser lithography, which can be produced with high accuracy and low defects in a smaller number of steps. A photo mask for KrF excimer laser lithography according to the present invention is one in which a resist pattern 18 efficiently absorbing a KrF excimer laser light (wavelength: about 248 nm) is formed directly on a quartz substrate 10. The resist pattern 18 comprises: an aqueous alkali-soluble resin having a high light shielding property, which incorporates a naphthol structure having at least one hydroxyl group bound to a naphthalene nucleus; or a radiation sensitive resist having, as a main component, an aqueous alkali-soluble resin containing a derivative of the above-mentioned aqueous alkali-soluble resin as a resin matrix.

21 Claims, 5 Drawing Sheets

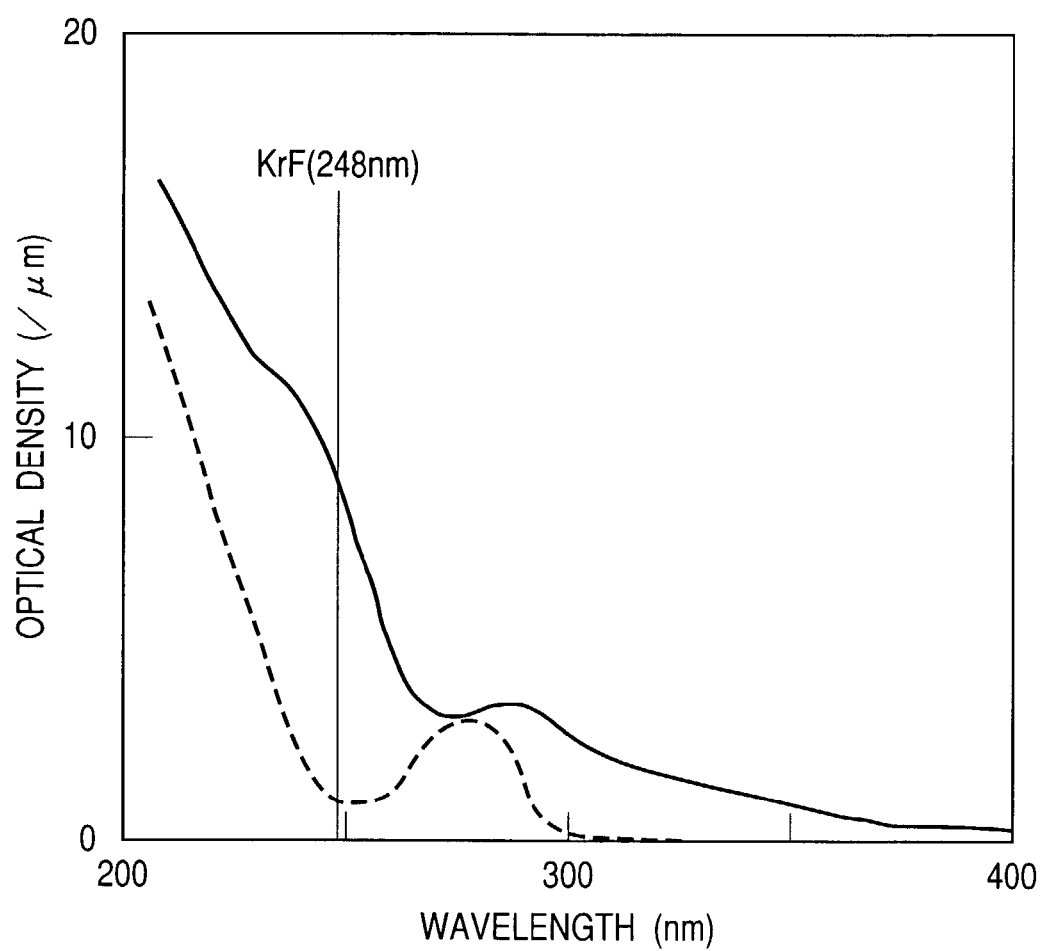

PHOTO MASK

BACKGROUND OF THE INVENTION

The present invention relates to a method of manufacturing an electronics device such as a semiconductor integrated circuit device, a superconductive device, a micromachine, a TFT (Thin Film Transistor), a circuit board and the like, and in particular to a technique effectively applied to a lithographic technique in a method step of manufacturing a semiconductor integrated circuit device.

In the method step of manufacturing a semiconductor integrated circuit device, a lithographic technique is used as a method of transferring a fine pattern onto a semiconductor wafer. In the lithographic technique, a projection exposure device is mainly used, and a pattern in a photo mask mounted to the projection exposure device is transferred onto the semiconductor wafer, whereby a device pattern thereon is formed.

Usually, the photo mask is produced by processing a light shielding material such as chromium (Cr) or the like formed on a transparent quartz substrate. That is, the photo mask is constituted by forming a light shielding film of chromium etc. in a desired shape on a quartz substrate.

The processing of the light shielding film is for example as follows: That is, an electron-beam resist is applied onto a light shielding film, and then a desired pattern is drafted on the electron-beam resist by an electron beam drafting device. Subsequently, a resist pattern with a desired shape is formed by development, and then the light shielding film is processed by dry etching or wet etching using the resist pattern as a mask. Thereafter, the resist is removed, and washing or the like of the light shielding film is performed to form a light-shielding pattern having a desired shape on the quartz substrate.

Besides the ordinary photo mask in which the light shielding film made of chromium, etc. is formed in a desired shape as described above, various mask structures for the purpose of improving resolution in lithography have been proposed in recent years. For example, in Japanese Patent Laid-open No. 4-136854, a translucent film is formed on a light shielding portion in a photo mask, and the phase of slight light passing through the translucent film and that of light passing through the transparent pattern are made inverse to each other. That is, the intensity of the light passing through the translucent film is quite low to expose the photoresist, and the phase of this light and that of light passing through the transparent pattern are made inverse to each other. The phase of light passing through the translucent film is made inverse to that of light passing through the transparent pattern used as a main pattern, and thus the intensity of light in the boundary between the transparent pattern and the translucent film approaches 0 (zero). As a result, the ratio of the intensity of light passing through the transparent pattern to that of light passing through the boundary is made relatively high, so that it is possible to obtain a light intensity distribution having high contrast in comparison with the ordinary photo mask using no translucent film.

The photo mask described in the above-mentioned reference is called an attenuation type phase-shift mask. This attenuation type phase-shift mask is obtained by replacing a light shielding film made of chromium etc. with an attenuation type phase-shift film, and is produced by almost the same steps as the steps of manufacturing the ordinary photo mask.

Further, there is an exposure method called super resolution capable of resolving much finer patterns than that of the wavelength of exposure light. The most effective method of forming the finer patterns among the super resolution is called an alternation type phase shifting exposure method. This alternation type phase shifting exposure method is a method of: forming a structure called phase shifters in which light shielding portions are put between respective exposure light transmission portions of the ordinary photo mask, namely, between respective window portions to which a quartz substrate is exposed, whereby phases of exposure light are made alternately inverse; and performing the light exposing with the structure. According to this light exposure method, the phase of light passing through the ordinary transmission portions and the phase of light penetrating the phase shifter are made inverse to each other, so that there occurs a region where the amplitude of light is 0 in the light shielding portions therebetween. When the amplitude becomes 0, the intensity of light also becomes 0. So, the resolution is significantly improved and the cycle between the light shielding portions and the phase shifters alternately arranged can be resolved to nearly ½ of the wavelength of exposure light. The photo mask having such light shielding portions and phase shifters is called an alternation type phase shift mask.

Involving higher accuracy and diversification of semiconductor integrated circuit devices, the ordinary photo mask used in the lithography technique requires severer processing accuracy. The phase shift mask having the special structure described above is also required. Therefore, generally, the production costs of about 20 to 40 photo masks prepared in manufacturing one kind of semiconductor integrated circuit device have been significantly higher, and the time required for production of such photo masks has been also increased.

Japanese Patent Laid-open No. 5-289307 discloses a method in which a light shielding film in a photo mask is formed from a radiation sensitive resist film such as a photoresist film in place of a conventional metal film such as Cr or the like. This method makes use of the properties of a benzene nucleus that is a major component of the ordinary electron-beam resist film or a light-sensitive resist film, the properties being that the benzene nucleus has an extremely high photo absorption band at the wavelength (about 193 nm) of an ArF (argon fluoride) excimer laser light source. Accordingly, this method does not require the step of etching a light shielding film or the step of removing a photoresist film, thereby enabling reduction in production costs of the photo masks, improvement in dimensional accuracy and reduction in defects.

SUMMARY OF THE INVENTION

KrF (krypton fluoride) excimer lithography is an exposure method used in fine processing of so many kinds of semiconductor integrated circuit devices such as integrated circuit devices or system LSIs or the like for special purposes. If higher accurate and lower default dense photo masks capable of being produced in a shorter time by a shorter process can be provided by using this method, the method will be extremely useful.

Many high-performance resists used in the existing KrF excimer lithography or electron beam lithography make use of a phenolic polymer resin or a derivative thereof as a polymer resin matrix bringing about film properties. The benzene nucleus structure in the phenolic polymer resin thus has the very large absorption maximum in the vicinity of the wavelength (about 193 nm) of ArF excimer laser light as described above, and so the transparency thereof at a wavelength of 193 nm is 1% or less even in a film thickness of only 0.1 μm. Accordingly, a resist material using such a resin as the matrix can be used to provide an almost ideal light shielding film whose transparency relative to the ArF excimer laser light is 0.01% or less even in the ordinary thickness (about 0.3 μm) of the film.

However, the above-mentioned resist has higher transparency in the vicinity of the wavelength (about 248 nm) of KrF excimer laser light, and its transparency is 30% or more even in the thickness of a fine pattern-forming film (usually about 0.3 to 1.0 μm). Accordingly, the above-mentioned resist cannot be used as a light shielding film for KrF excimer laser lithography as it stands.

A method of compounding a photo absorbing material efficiently absorbing light of the KrF excimer laser light wavelength (about 248 nm) with a large number of existing high-performance resists is an easily anticipated method. For example, anthracene derivatives such as anthrarobin, 1-methoxy-9,10-dibromoanthracene, 2-hydroxymethylanthracene, 9-hydroxymethylanthracene, 9-bromoanthracene, 9-chloromethylanthracene, methoxymethylanthracene, 1-aminoanthracene, acetoxyanthracene and the like show high photo absorption at the KrF excimer laser light wavelength, and thus can serve as efficient photo absorbing materials.

However, when amounts necessary to exhibit a sufficient light shielding performance are added in the case of compounding the above-mentioned photo absorbing material with the resist, there arises a problem of inevitable deterioration in the resist performance. That is, there is a limit to the amounts of photo absorbing material capable of being compounded during suppression of performance deterioration in the resist, so that keeping the balance between the sufficient photo absorption performance and the resist performance is generally a difficult technical problem.

The quantitatively major components in the resist composition are a phenolic polymer resin and a derivative thereof used as a polymer resin matrix bringing about the film properties. By chemically bonding the above-mentioned efficient photo absorbing material to the above-mentioned polymer resin matrix, the resultant resin may effectively absorb light of the KrF excimer laser light wavelength and simultaneously have aqueous alkali solubility similar to that of the phenolic polymer resin. For example, 9-hydroxymethylanthracene, 9-bromoanthracene and 9-chloromethylanthracene among the anthracene derivatives described above can be bound directly to a phenolic polymer resin by a condensation reaction and an etherification reaction. However, when the light absorbing material of the amounts necessary to exhibit a sufficient light shielding performance is bound to the phenolic polymer resin, the aqueous alkali solubility of the resin itself significantly deteriorates and thus there arises a problem of inevitable performance deterioration in the resist.

In contrast, if a resin itself effectively absorbs light of the KrF excimer laser light wavelength and has aqueous alkali solubility similar to that of the phenolic polymer resin, the resin can be realized as a resist having the same ability to be developed with an aqueous alkali as that of a large number of the existing high-performance resists and can serve as a KrF excimer laser light shielding film.

An object of the present invention is to provide a radiation sensitive resist containing a novel polymer resin matrix efficiently absorbing KrF excimer laser light (wavelength: about 248 nm) in place of a phenolic polymer resin or the derivative thereof used as a polymer resin matrix in the existing high-performance resist.

Another object of the present invention is to provide a photo mask for KrF excimer laser lithography by using the above-described radiation sensitive resist as a light shielding film.

A still other object of the present invention is to provide a technique of manufacturing electronics devices by using the above-described photo mask for KrF excimer laser lithography.

The above-described and other objects and the novel features of the present invention will be apparent from the description of this specification and the accompanying drawings.

In order to obtain a resist composition having process exchangeability and performance similar to those of the existing high-performance resist and efficiently absorbing KrF excimer laser light (wavelength: about 248 nm), an aqueous alkali-soluble resin or the derivative thereof incorporating a structure of a KrF excimer laser photo absorbing material containing an aqueous alkali soluble group may be used as a polymer resin matrix in place of the conventional phenolic polymer resin or a derivative thereof.

The present inventor(s) has found that a naphthol structure having one or more hydroxyl groups bound to a naphthalene nucleus is useful as a structure of a KrF excimer laser photo absorbing material containing an aqueous alkali-soluble group.

As the aqueous alkali-soluble resin or the derivative containing the above-described naphthol structure therein, (a) an aqueous alkali-soluble resin consists of a condensation polymer of naphthalene derivatives with aldehyde, the naphthalene derivatives being represented by the below general formula (1).

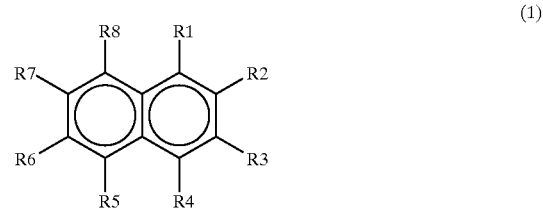

(1)

(In the above formula, R1 to R8 each represent an atom or an atomic group selected from a hydroxyl group, hydrogen, an alkyl group substituted or non-substituted with the carbon number of 1 to 4, halogen, a phenyl group, a methoxy group, an ethoxyethyl group, a cyclopropyl group, an acetyl group and a carboxyl group. Also, R1 to R8 necessarily contain one or two hydroxyl group and contain at least two hydrogen atoms.)

(b) An aqueous alkali-soluble resin consists of a condensation polymer of naphthalene derivatives represented by the above-mentioned general formula (1) with a hydroxymethyl-substituted compound represented by the blow general formula (2), (3) or (4).

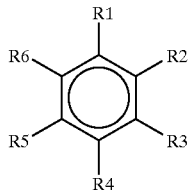
(2)

(In the above formula, R1 to R6 each represent an atom or an atomic group selected from a hydroxymethyl group, hydrogen, an alkyl group substituted or non-substituted with the carbon number of 1 to 4, halogen, a hydroxyl group, a phenyl group, a methoxy group, an ethoxyethyl group, a cyclopropyl group and an acetyl group. Also, R1 to R6 contain at least two hydroxymethyl groups.)

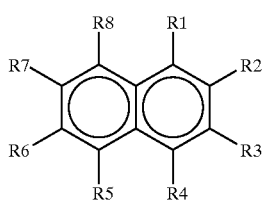
(3)

(In the above formula, R1 to R8 each represent an atom or an atomic group selected from a hydroxymethyl group, hydrogen, an alkyl group substituted or non-substituted with the carbon number of 1 to 4, halogen, a hydroxyl group, a phenyl group, a methoxy group, an ethoxyethyl group, a cyclopropyl group and an acetyl group. Also, R1 to R8 contain at least two hydroxymethyl groups.)

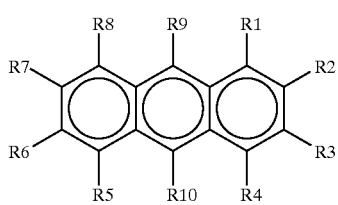
(4)

(In the above formula, R1 to R10 each represent an atom or an atomic group selected from a hydroxymethyl group, hydrogen, an alkyl group substituted or non-substituted with the carbon number of 1 to 4, halogen, a hydroxyl group, a phenyl group, a methoxy group, an ethoxyethyl group, a cyclopropyl group and an acetyl group. Also, R1 to R10 contain at least two hydroxymethyl groups.)

(c) An aqueous alkali-soluble resin consists of an esterification product of a naphthoic acid derivative and a phenolic polymer or polyphenol compound, said naphthoic acid derivatives being represented by the below general formula (5).

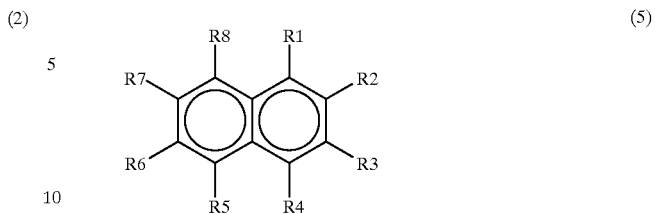
(5)

(In the above formula, R1 to R8 each represent an atom or an atomic group selected from a carboxyl group, a hydroxyl group, hydrogen, an alkyl group substituted or non-substituted with the carbon number of 1 to 4, halogen, a phenyl group, a methoxy group, an ethoxyethyl group, a cyclopropyl group and an acetyl group. Also, R1 to R8 necessarily contain one carboxyl group and contain at least one hydroxyl group.)

(d) Derivatives of the above-mentioned aqueous alkali-soluble resins (a) to (c) are enumerated.

The naphthalene derivatives represented by the above-mentioned general formula (1) include 1-naphthol, 1,3-dihydroxynaphthalene, 1,6-dihydroxynaphthalene, 1,7-dihydroxynaphthalene, 1,4-dihydroxynaphthalene, 1,5-dihydroxynaphthalene, 2,6-dihydroxynaphthalene, 2,3-dihydroxynaphthalene, and 2,7-dihydroxynaphthalene, etc.

Further, the hydroxymethyl-substituted compound represented by the above-mentioned general formula (2), (3) or (4) includes a compound containing at least two hydroxymethyl groups such as 2,6-bis(hydroxymethyl)-p-cresol, 3,6-bis(hydroxymethyl)durene, 2,3-bis(hydroxymethyl)naphthalene, 1,8-bis(hydroxymethyl)anthracene, and 2,2'-bis(hydroxymethyl)diphenylether, etc.

Further, the naphthoic acid derivatives represented by the above-mentioned general formula (5) include 1-hydroxy-2-naphthoic acid, 2-hydroxy-1-naphthoic acid, 2-hydroxy-3-naphthoic acid, 6-hydroxy-1-naphthoic acid, 6-hydroxy-2-naphthoic acid, 1,4-dihydroxy-2-naphthoic acid, 3,5-dihydroxy-2-naphthoic acid, and 3,7-dihydroxy-2-naphthoic acid, etc.

Further, the phenolic polymer or polyphenol compound forming the esterification product with the naphthoic acid derivatives represented by the above-mentioned general formula (5) includes a phenolic polymer resin such as poly(p-hydroxystyrene) and an m,p-cresol novolak resin and the like. But, various kinds of other polyphenol compounds can be also used insofar as having a spin-coatable film forming property from solvent.

The various kinds of aqueous alkali-soluble resins (a) to (d) described above can be each used as a polymer resin matrix to obtain a high-performance resist composition efficiently absorbing KrF excimer laser light. This can realize a photo mask for KrF excimer laser lithography, wherein a resist pattern itself formed on a photo mask substrate may serve as a light shielding pattern of KrF excimer laser light.

Out of the various aqueous alkali-soluble resins described above, the resin containing no phenol nucleus structure can be used as a resin matrix in a resist composition with particularly high light shielding properties relative to KrF excimer laser light. By using the resist composition with particularly high light shielding properties, a resist film maintaining necessary light shielding properties can be made thinner due to such properties. Generally speaking, as the resist film is made thinner, higher resolution thereof can be obtained. So, a higher-performance photo mask for KrF excimer laser lithography can be realized due to such higher resolution.

Also, among the various kinds of aqueous alkali-soluble resins described above, the resin containing a phenol nucleus structure can sufficiently maintain light shielding properties for KrF excimer laser light relative to KrF excimer laser light and simultaneously have sufficient light shielding and light resistance relative to ArF excimer laser light. Therefore, by employing a resist composition that uses this resin as a polymer resin matrix, a photo mask having a light shielding film corresponding to both light sources of KrF excimer laser light and ArF excimer laser light can be produced. That is, a photo mask for either KrF or ArF lithography can be produced through the same photo mask production process as occasion demands.

Further, among the various kinds of aqueous alkali-soluble resins described above, the resin, which includes through an naphthoic acid esterification reaction a naphthol structure in a phenol resin or polyphenol compound similar to the aqueous alkali-soluble resin prevailingly applied to the conventional resist compositions, can easily maintain the reaction mechanism of the conventional resist by the remaining phenol structure, and that can produce a photo mask having a resist shielding pattern excellent in light resistance.

As described above, the resist composition or the derivative thereof, which contains as an aqueous alkali-soluble group a naphthol structure having one or more hydroxyl groups bound to a naphthalene nucleus, is employed as the polymer matrix. Therefore, such a high-performance photo mask for KrF excimer lithography can be realized that a resist pattern itself formed on a photo mask substrate can serve as a light shielding pattern for KrF excimer laser light.

The photo mask for KrF excimer laser lithography according to the present invention is not necessarily limited to the normal photo mask. That is, the photo mask of the present invention can be also applied to a phase shift mask such as an alternation type shift mask, and the resist composition of the present invention can be used on a photo mask substrate in which a predetermined phase shifter pattern is formed in advance, thereby forming a light shielding pattern.

Since the resist pattern itself formed on a photo mask substrate serves as a light shielding film pattern for KrF excimer laser light, the photo mask of the present invention does not require the step of transferring the resist pattern to a lower light shielding film made of a metal such as chromium, etc. similarly to the conventional photo mask. Accordingly, due to this, the number of steps for manufacturing the photo mask can be reduced and, in consequence, the photo mask can be produced in a shorter time by the shorter process to realize a photo mask with high accuracy and low defect density. That is, the photo mask of the present invention is extremely useful for application to KrF excimer laser lithography used in the fine processing of much various kinds of semiconductor integrated circuit devices such as integrated circuit devices and system LSIs and the like for special purposes.

Generally, the photo mask is placed under the exposure environment for a long time in the projection-exposure step of KrF excimer lithography or the like used in manufacturing semiconductor integrated circuit devices. For the reason, the light shielding pattern made of an organic resin having a photo absorption band at the wavelength of exposure light is inevitably subject to any photo chemical deterioration. Therefore, in order to effectively employ the photo mask of the present invention using the resist composition made of an organic resin as a light shielding film in manufacturing semiconductors, applying the present invention to some photo masks selected from about 20 to 40 photo masks prepared for manufacturing one kind of semiconductor integrated circuit device is generally effective in the production costs thereof.

For example, in producing semiconductor integrated circuit devices called system LSIs, the step of processing gates at a transistor element level makes use of ordinary photo masks having light shielding film patterns of a metal such as Cr or the like or use of expensive and durable phase shift masks because fine processing is required and patterns are common among many kinds of devices. In the processing of circuit layers, on the other hand, specifications are varied depending on the customers, and that the number of exposures used in the processing is often low. Accordingly, if the photo mask for KrF excimer laser lithography according to the present invention is applied to such circuit processing, the production costs of system LSIs can be effectively reduced. As a matter of course, the photo mask of this invention can, depending on the intended processing layer, be applied not only to various kinds of photo masks for KrF excimer laser lithography such as alternation type shift mask or attenuation type shift mask or the like but also to photo masks for ArF excimer laser lithography produced by ordinary mask production methods. For example, a photo mask for ArF excimer laser lithography, in which its light shielding film pattern is made of a metal film or an ordinary electron beam resist, is used for exposure required until the step of forming gate electrodes. The photo mask for KrF excimer lithography according to the present invention can be appropriately used in the processing of the upper layer thereof. Thereby, various kinds of system LSIs can be effectively produced at lower costs.

There are various kinds of aqueous alkali-soluble resins applicable to the present invention. Particularly, the resin, consisting of a condensation polymer of the naphthalene derivative represented by the above-mentioned general formula (1) with the hydroxymethyl-substituted compound represented by the above-mentioned general formula (2), has a sufficient ability to shield not only KrF excimer laser light but also ArF excimer laser light and is excellent in light resistance.

The resin, consisting of a condensation polymer of the naphthalene derivative represented by the above-mentioned general formula (1) with the hydroxymethyl-substituted compound represented by the above-mentioned general formula (3) or (4), or the resin, consisting of a condensation polymer of the naphthalene derivative represented by the above-mentioned general formula (1) with formaldehyde or hydroxynaphthoaldehyde wherein two hydroxyl or carboxyl groups as substituents are contained in at least 5% of the component of the naphthalene derivative, has a significant ability to absorb KrF excimer laser light. In a resist composition obtained by using this resin, its resist film used in formation of light shielding patterns of KrF laser light can be made small in thickness, so that it is possible to relatively enhance the substantial resolution performance of the resist. When the component of the naphthalene derivative containing two hydroxyl or carboxyl groups is less than 5%, solubility to a aqueous alkali developing solution widely used is lowered and thus an excellent resist composition is difficult to obtain.

Further, the resin, consisting of an esterification product of the naphthoic acid derivative represented by the above-mentioned general formula (5) and a phenolic polymer or polyphenol compound wherein the degree of esterification is 30% or more, has a sufficient ability to shield not only KrF excimer laser light but also ArF excimer laser light and, particularly, has an excellent light resistance to KrF excimer laser light. Meanwhile, since the resin whose the degree of esterification is less than 30% lacks the photo absorption of KrF excimer laser light, the thick film thereof is required to secure sufficiently the light shielding performance and thus an excellent resolution of the resist is difficult to obtain.

The high-performance resist, employed in the existing KrF excimer lithography or the electron beam lithography widely applied to the manufacturing of photo masks, uses a phenolic polymer resin or the derivative thereof as a polymer resin matrix bringing about the film properties thereof. The aqueous alkali-soluble resin of the present invention has the soluble properties of an aqueous alkali similarly to the phenolic polymer resin, and so it is possible to produce the high-performance resist, which uses the above-mentioned alkali-soluble resin or the derivative thereof as a polymer resin matrix.

In the radiation sensitive resist of the present invention, a composition of the well-known chemical amplification resist can be utilized. The chemical amplification resist facilitates high sensitivity and so is advantageous for the case of being used as an electron beam resist particularly requiring high sensitivity. In manufacturing photo masks by the electron beam lithography, the radiation sensitive resist of the present invention is mainly used with the chemical amplification resist.

The typical chemical amplification negative-working resist composition consists of an aqueous alkali-soluble resin matrix, an acid-crosslinker or a precursor to change a dissolution inhibitor by an acid-catalyst, and an acid generator, as the essential components. The negative-working radiation sensitive resist of the present invention is characterized in that an aqueous alkali-soluble resin incorporating therein the above-mentioned naphthol structure is used as an aqueous alkali-soluble resin matrix.

The above-mentioned acid-crosslinker includes the well-known hexamethoxymethylmelamine, etc. Further, the acid-crosslinker or the precursor to change a dissolution inhibitor by an acid-catalyst includes primary to tertiary alcohols having a hydroxyl group on carbon bound directly to an aromatic nucleus, for example, includes m-xylylene glycol, p-xylylene glycol, 1,3,5-benzene trimethanol, 2-hydroxy-5-methyl-1,3-benzene methanol, 2,3,5,2,3,5-hexahydroxymethyl-4,4-dihydroxydiphenyl, bis(3,5-dihydroxymethyl-4-hydroxyphenyl)methylene, 2,2-bis(3,5-dihydroxymethyl-4-hydroxyphenyl)propane, 1,4-bis(2-(3,5-dihydroxymethyl-4-hydroxyphenyl)propyl)benzene, 1,3-bis(2-hydroxy-2-propyl)benzene, 1,3-bis(3-hydroxy-3-pentyl)benzene, 1,3-bis(2-hydroxy-2-propyl)-5-methoxybenzene, 5-chloro-1,3-bis(2-hydroxy-2-propyl)benzene, 5-bromo-1,3-bis(2-hydroxy-2-propyl)benzene, 1,4-bis(2-hydroxy-2-propyl) benzene, 1,4-bis(3-hydroxy-3-pentyl)benzene, 1,4-bis(2-hydroxy-2-propyl)-2,3,5,6-tetramethylbenzene, 2-chloro-1,4-bis(2-hydroxy-2-propyl)benzene, 2-bromo-1,4-bis(2-hydroxy-2-propyl)benzene, 1,3,5-tris(2-hydroxy-2-propyl) benzene, 1,3,5-tris(3-hydroxy-3-pentyl)benzene, 1,5-bis(2-hydroxy-2-propyl)naphthalene, 1,4-bis(2-hydroxy-2-propyl)naphthalene, and 9,10-bis(2-hydroxy-2-propyl) anthracene, etc.

The typical chemical amplification positive-working resist composition has, as the essential components, a hydroxyl group protected by an acid-degradable protective group, and consists of: a so-called two-component system having a resin matrix inhibited from being soluble in an aqueous alkali and an acid generator; or a so-called three-component system having an aqueous alkali-soluble resin, an inhibitor of aqueous alkali dissolution with an acid-degradable protective group and an acid generator. The positive-working radiation sensitive resist of the present invention is characterized in that the aqueous alkali-soluble resin, in which the naphthol structure thus descried has been included, or the derivative thereof is applied as the resin matrix.

In this invention, the derivative of the aqueous alkali-soluble resin is a resin, having a structure obtained by chemically modifying the aqueous alkali-soluble resin incorporating therein the naphthol structure of this invention, wherein a hydroxyl group protected by an acid-degradable protective group is chemically added, thus inhibiting the solubility of an aqueous alkali. The acid-degradable protective group includes the well-known group such as a t-butoxycarbonyl group, a t-butyl group, a t-butoxycarbonylmethyl group, a tetrahydropyranyl group, and a 1-ethoxyethyl group, etc.

The acid generator applied to the above-mentioned chemical amplification resist composition includes: onium salts such as triphenylsulfonium trifluoromethanesulfonate, diphenyliodonium trifluoromethanesulfonate and di-t-butylphenyliodonium trifluoromethanesulfonate, etc.; sulfonic acid esters such as o-dinitrobenzyl p-toluenesulfonate, tris(methanesulfonyloxy)benzene and tris(ethanesulfonyloxy) benzene, etc.; imide sulfonates such as naphthylimide trifluoromethanesulfonate, etc.; and organic halides such as tris(2,3-dibromopropyl)isocyanurate, etc.

The radiation sensitive resist of this invention is not limited to the chemical amplification resist composition suitable for the production of photo masks using electron beam lithography. The resin matrix used in the radiation sensitive resist of the present invention is characterized by having a extremely high light shielding property of the KrF laser light wavelength, and has sufficient transparency at the wavelength of Ar laser (363.8 nm) used in the production of photo masks by the well-known laser drafting. In the production of photo masks by this laser drafting, an i-line positive-working photo resist employing an existing novolak resin and an existing diazonaphthoquinone type photo active compound is used. By using the aqueous alkali-soluble resin incorporating the naphthol structure of the present invention therein in place of a novolak resin, the radiation sensitive resist usable in the production of photo masks by laser drafting can be prepared. Further, this may produce the photo masks for KrF excimer laser lithography using a resist pattern as a light shielding film by the existing laser drafting device. Further, even the chemical amplification resist composition can be used if having sensitivity at the Ar laser wavelength (363.8 nm) as an acid generator, or can be used along with a sensitizer for the above-mentioned wavelength.

The aqueous alkali-soluble resin of the present invention is characterized in that the light shielding property of the KrF laser light wavelength is extremely high. Accordingly, when the aqueous alkali-soluble resin is mixed with the ordinary phenol resin having high transparent property relative to the KrF laser light wavelength, the radiation sensitive resists having almost arbitrary transparency can be prepared. Therefore, attenuation type phase-shift masks also can be easily produced. The transparency of a light-shielding film pattern, formed by the radiation sensitive resist obtained by regulating a mixing ratio of the ordinary phenol resin and the aqueous alkali-soluble resin, is set in the range of 2 to 16%, more preferably 4 to 9%, relative to KrF excimer laser light. Simultaneously, the phase difference between respective exposure lights passing through the film and the penetration portion is adjusted to D or nearly 3D. As a result, this film can be used as an attenuation type phase-shift mask for KrF excimer laser lithography.

FIG. 4 shows results obtained by measuring an UV absorption spectrum of a resist resin. The solid line in this drawing indicates an UV absorption spectrum of a condensation resin of 1-naphthol and 1,6-dihydroxynaphthalene with 2,6-bis(hydroxymethyl)-p-cresol used as one example of the aqueous alkali-soluble resin of this invention. The broken line indicates an UV absorption spectrum of existing poly(p-hydroxystyrene) used as a base resin in a resist for KrF excimer laser lithography or in a resist for EB. As can be seen from these spectra, the aqueous alkali-soluble resin of this invention has a property of adsorbing KrF excimer laser light (wavelength: about 248 nm).

Further, the present invention includes the following items 1 to 6.

1. An aqueous alkali-soluble resin comprises a condensation polymer of naphthalene derivatives represented by the below general formula (1) with formaldehyde or hydroxynaphthaldehyde, wherein at least 5% component of said naphthalene derivatives contains two hydroxyl or carboxyl groups as substituents.

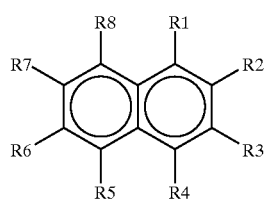

(1)

(In the formula, R1 to R8 each represent an atom or an atomic group selected from a hydroxyl group, hydrogen, an alkyl group substituted or non-substituted with the carbon number of 1 to 4, halogen, a phenyl group, a methoxy group, an ethoxyethyl group, a cyclopropyl group, an acetyl group and a carboxyl group. Also, R1 to R8 necessarily contain one or two hydroxyl groups and contain at least two hydrogen atoms.)

2. An aqueous alkali-soluble resin comprises a condensation polymer of naphthalene derivatives represented by the below general formula (1) with a hydroxymethyl-substituted compound represented by the below general formula (2).

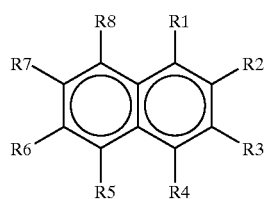

(1)

(In the formula, R1 to R8 each represent an atom or an atomic group selected from a hydroxyl group, hydrogen, an alkyl group substituted or non-substituted with the carbon number of 1 to 4, halogen, a phenyl group, a methoxy group, an ethoxyethyl group, a cyclopropyl group, an acetyl group and a carboxyl group. Also, R1 to R8 necessarily contain one or two hydroxyl groups and contain at least two hydrogen atoms.)

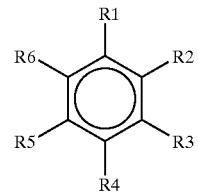

(2)

(In the formula, R1 to R6 each represent an atom or an atomic group selected from a hydroxymethyl group, hydrogen, an alkyl group substituted or non-substituted with the carbon number of 1 to 4, halogen, a hydroxyl group, a phenyl group, a methoxy group, an ethoxyethyl group, a cyclopropyl group and an acetyl group, and R1 to R6 contain at least two hydroxymethyl groups.)

3. An aqueous alkali-soluble resin comprises a condensation polymer of naphthalene derivatives represented by the below general formula (1) with a hydroxymethyl-substituted compound represented by the below general formula (3) or (4).

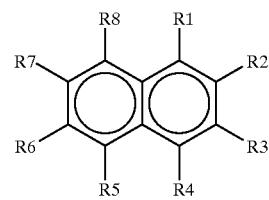

(1)

(In the formula, R1 to R8 each represent an atom or an atomic group selected from a hydroxyl group, hydrogen, an alkyl group substituted or non-substituted with the carbon number of 1 to 4, halogen, a phenyl group, a methoxy group, an ethoxyethyl group, a cyclopropyl group, an acetyl group and a carboxyl group. Also, R1 to R8 necessarily contain one or two hydroxyl groups and contain at least two hydrogen atoms.)

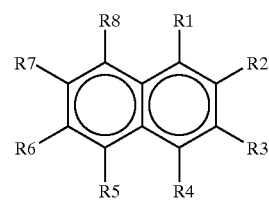

(3)

(In the formula, R1 to R8 each represent an atom or an atomic group selected from a hydroxymethyl group, hydrogen, an alkyl group substituted or non-substituted with the carbon number of 1 to 4, halogen, a hydroxyl group, a phenyl group, a methoxy group, an ethoxyethyl group, a cyclopropyl group and an acetyl group. Also, R1 to R8 contain at least two hydroxymethyl groups.)

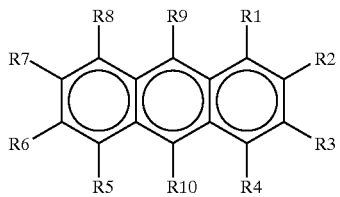

(4)

(In the formula, R1 to R10 each represent an atom or an atomic group selected from a hydroxymethyl group, hydrogen, an alkyl group substituted or non-substituted with the carbon number of 1 to 4, halogen, a hydroxyl group, a phenyl group, a methoxy group, an ethoxyethyl group, a cyclopropyl group and an acetyl group. Also, R1 to R10 contain at least two hydroxymethyl groups.)

4. An aqueous alkali-soluble resin comprises an esterification product of naphthoic acid derivatives represented by the below general formula (5) with a phenolic polymer or a polyphenol compound, wherein a degree of esterification of said phenolic polymer or polyphenol compound is 30% or more.

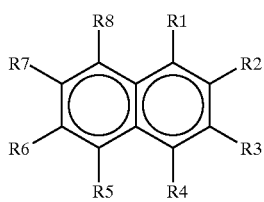

(5)

(In the formula, R1 to R8 each represent an atom or an atomic group selected from a carboxyl group, a hydroxyl group, hydrogen, an alkyl group substituted or non-substituted with the carbon number of 1 to 4, halogen, a phenyl group, a methoxy group, an ethoxyethyl group, a cyclopropyl group and an acetyl group. Also, R1 to R8 necessarily contain one carboxyl group and contain at least one hydroxyl group.)

5. A radiation sensitive resist comprises containing the aqueous alkali-soluble resin according to any one of items 1 to 4 or the derivative thereof, as a polymer matrix bringing about film properties.

6. A method of manufacturing an electronics device, comprises the steps of:

irradiating a photo mask on which a predetermined light shielding film pattern is drafted; and repeatedly performing a projection exposure for transferring said pattern onto a wafer via a projection optics to sequentially form a predetermined pattern thereon, wherein the method includes at least a projection exposure step of using a KrF excimer laser light, and a photo mask used in said projection exposure step of using the KrF excimer laser light is the photo mask for KrF excimer laser lithography according to any one of claims 1 to 5.

BRIEF DESCRIPTION OF THE DRAWINGS

FIG. 4 shows results obtained by measuring an UV absorption spectrum of a resist resin.

DESCRIPTION OF THE PREFERRED EMBODIMENTS

Figure 1:
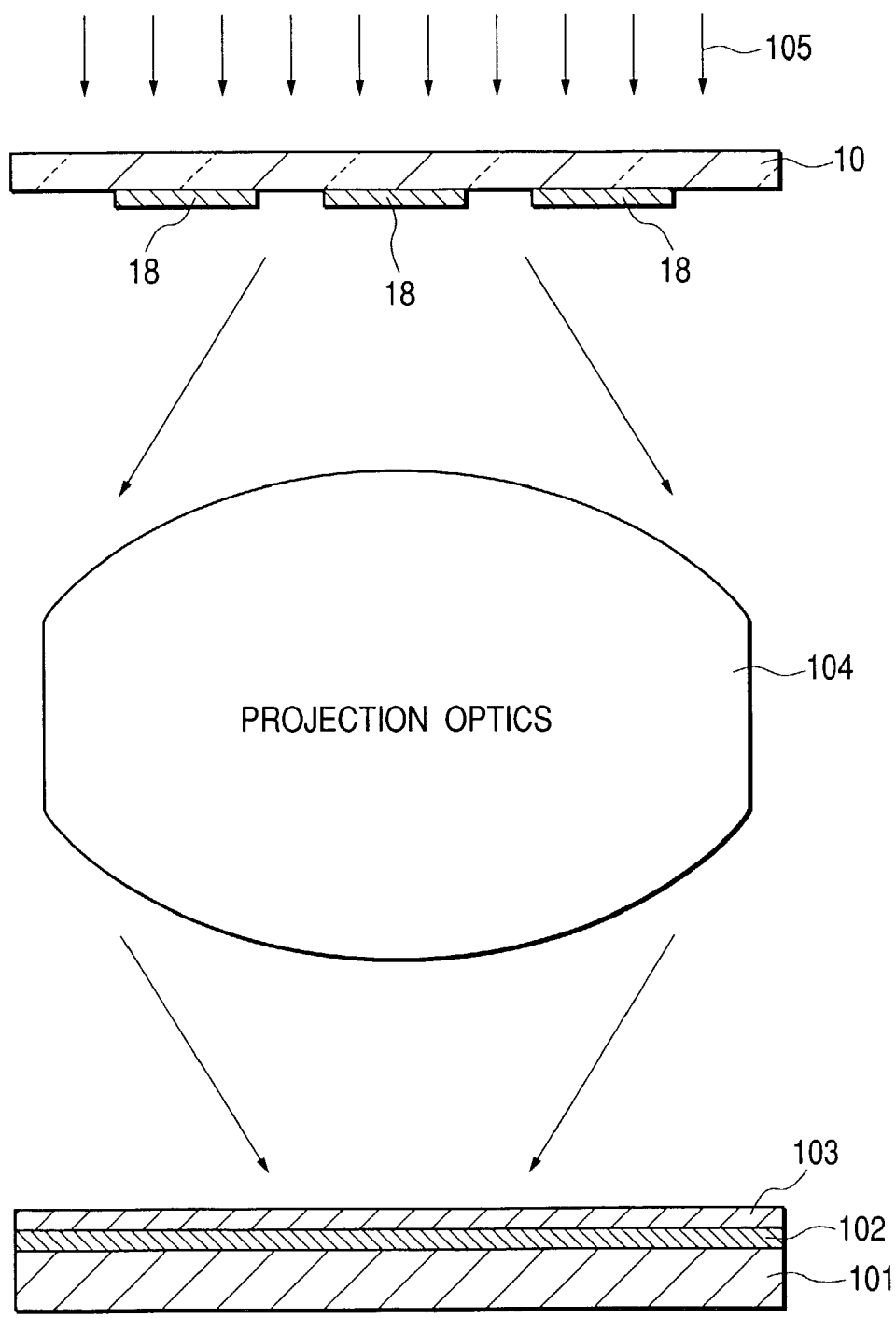
FIG. 1 is a configurative view showing an exposure method employing a resist light shielding film photo mask of the present invention.

Hereinafter, the present invention will be described in more detail by reference to Examples but is not limited to these Examples.

SYNTHESIS EXAMPLE 1

After 11.53 g (0.08 mol) of 1-naphthol, 3.20 g (0.02 mol) of 1,5-dihydroxynaphthalene, 8.34 g (0.1 mol) of 36% aqueous formaldehyde were introduced into a 200 ml three-necked flask, 100 ml tetrahydrofuran was introduced into the flask and agitated and the mixture was dissolved. 2 g of p-toluenesulfonic acid, hydrate, was weighed, and then dissolved in 10 ml tetrahydrofuran, and poured into the above-mentioned flask which was then equipped with a reflux condenser, a thermometer and a nitrogen inlet tube. The flask was placed on an oil bath preset at 70° C. The mixture was refluxed for 6 hours while being agitated and while nitrogen was introduced into it (about 10 cc/min.). The temperature in the reaction vessel was then 64 to 68° C. After reflux for 6 hours, the reaction vessel was removed from the oil bath and air-cooled to room temperature in the same nitrogen atmosphere. The solution was transferred from the reaction vessel to a 200 ml evaporating flask and concentrated until its volume was reduced by almost half in an evaporator. At this time, the heating temperature in the evaporator was 45 to 50° C. The reaction solution thus concentrated was dissolved well in 100 ml ethyl acetate and transferred to a separatory funnel. The reaction solution was washed 6 times with about 20% saline solution (200 ml for each washing), and then washed once with distilled water (200 ml for washing). When the wash became almost neutral, about 50 g sodium sulfate (anhydrate) was introduced into a 300 ml beaker and the ethyl acetate solution in the separatory funnel was transferred to the beaker and left for 2 to 3 hours and dried. The sodium sulfate used in the drying was filtered off, and the sodium sulfate filtered off with ethyl acetate was further rinsed. All the ethyl acetate solutions were combined (about 200 ml), and transferred to a 300 ml evaporating flask, and concentrated until its volume was reduced to almost 70 ml in an evaporator. At this time, the heating temperature in this evaporator was 40 to 45° C. 200 ml hexane was introduced into a 300 ml beaker, into which the concentrated ethyl acetate solution was poured while being agitated well, and so the precipitates thereof was formed. The liquid portion was almost removed by decantation, and then the precipitates were dried for 3 hours in a vacuum dryer to remove the residual solvent. At this time, heating was not performed. The yield was about 12 g. The weight average molecular weight of the resultant resin, as determined by gel permeation chromatography, was about 3800 in terms of polystyrene equivalent molecular weight. Further, the absorbance of a film of this resin measured at a wavelength of 248 nm was 16.1 per $\mu$m of film thickness. Moreover, the rate of dissolution of this resin film in an aqueous tetramethyl ammonium hydroxide solution (2.38%) was about 10 nm/sec.

SYNTHESIS EXAMPLE 2

By using 17.2 g of 2-hydroxy-1-naphthaldehyde in place of the aqueous formaldehyde of Synthesis Example 1, a resin was obtained in the same manner as in Synthesis Example 1 except 2-hydroxy-1-naphthaldehyde. The yield was about 18 g. The weight average molecular weight of the resin obtained, as determined by gel permeation chromatography, was about 1800 in terms of polystyrene equivalent molecular weight. Further, the absorbance of a film of this resin measured at a wavelength of 248 nm was 17.4 per $\mu$m of film thickness. Moreover, the rate of dissolution of this resin film in an aqueous tetramethyl ammonium hydroxide solution (2.38%) was about 130 nm/sec.

SYNTHESIS EXAMPLE 3

After 11.53 g (0.08 mol) of 1-naphthol, 3.20 g (0.02 mol) of 1,6-dihydroxynaphthalene, 8.34 g (0.1 mol) of 36% aqueous formaldehyde were introduced into a 200 ml three-necked flask, 100 ml tetrahydrofuran was introduced into the flask and agitated and the mixture was dissolved. 2 g of p-toluenesulfonic acid, hydrate, was weighed, and then dissolved in 10 ml tetrahydrofuran, and introduced into the above-mentioned flask which was then equipped with a reflux condenser, a thermometer and a nitrogen inlet tube. The flask was placed on an oil bath preset at 70° C., and the mixture was refluxed for 8 hours while being agitated and while nitrogen was introduced into it (about 10 cc/min.). At this time, the temperature in the reaction vessel was 64 to 68° C. After reflux for 8 hours, the reaction vessel was removed from the oil bath and air-cooled to room temperature in the same nitrogen atmosphere. The solution was transferred from the reaction vessel to a 200 ml evaporating flask and concentrated until its volume was reduced by almost half in an evaporator. At this time, the heating temperature in the evaporator was 45 to 50° C. The reaction solution thus concentrated was dissolved well in 100 ml ethyl acetate and thereafter was transferred to a separatory funnel. The reaction solution was washed 6 times with about 20% saline solution (200 ml for each washing) and then washed once with distilled water (200 ml for washing). When the wash became almost neutral, about 50 g sodium sulfate (anhydrate) was introduced into a 300 ml beaker and the ethyl acetate solution in the separatory funnel was transferred to the beaker and left for 2 to 3 hours and dried. The sodium sulfate used in drying was filtered off and rinsed with ethyl acetate. All the ethyl acetate solutions were combined (about 200 ml) and transferred to a 300 ml evaporating flask and concentrated until its volume was reduced to almost 70 ml in an evaporator. At this time, the heating temperature in this evaporator was 40 to 45° C. 200 ml hexane was introduced into a 300 ml beaker, into which the concentrated ethyl acetate solution was poured while being agitated well, and so the precipitates thereof were formed. The liquid portion was almost removed by decantation, and then the precipitates were dried for 3 hours in a vacuum dryer to remove the residual solvent. At this time, heating was not performed. The yield was about 13 g. The weight average molecular weight of the resin obtained, as determined by gel permeation chromatography, was about 3200 in terms of polystyrene equivalent molecular weight. Further, the absorbance of a film of this resin measured at a wavelength of 248 nm was 20.4 per $\mu$m of film thickness. Moreover, the rate of dissolution of this resin film in an aqueous tetramethyl ammonium hydroxide solution (2.38%) was about 150 nm/sec.

SYNTHESIS EXAMPLE 4

After 13.0 g (0.09 mol) of 1-naphthol, 1.6 g (0.01 mol) of 1,6-dihydroxynaphthalene, 8.34 g (0.1 mol) of 36% aqueous formaldehyde were introduced into a 300 ml three-necked flask, 100 ml tetrahydrofuran was introduced into the flask and agitated and the mixture was dissolved. 2.0 g of p-toluenesulfonic acid, hydrate, was weighed, and then dissolved in 10 ml tetrahydrofuran, and introduced into the flask which was then equipped with a reflux condenser, a thermometer and a nitrogen inlet tube. The flask was placed on an oil bath preset at 70° C., and the mixture was refluxed for 6 hours while being agitated and while nitrogen was introduced into it (about 10 cc/min.). After reflux for 6 hours, the reaction vessel was removed from the oil bath and air-cooled to room temperature in the same nitrogen atmosphere. The solution was transferred from the reaction vessel to a 300 ml evaporating flask and concentrated until its volume was reduced by almost half in an evaporator. At this time, the heating temperature in the evaporator was 45 to 50° C. The reaction solution thus concentrated was dissolved well in 200 ml ethyl acetate, and thereafter was transferred to a separatory funnel and washed 4 times with distilled water (200 ml for each washing). By washing 4 times, the wash became almost neutral. About 100 g sodium sulfate (anhydrate) was introduced into a 500 ml beaker, and the ethyl acetate solution in the separatory funnel was transferred to the beaker and left for 2 to 3 hours and dried. The sodium sulfate used in drying was filtered off and further rinsed with ethyl acetate. All the ethyl acetate solutions were combined (about 150 to 200 ml) and transferred to a 500 ml evaporating flask and concentrated until its volume was reduced to almost 100 ml in an evaporator. At this time, the heating temperature in this evaporator was 40 to 45° C. 300 ml hexane was introduced into a 500 ml beaker, into which the concentrated ethyl acetate solution was then poured while being agitated well, and so the precipitates thereof were formed. The liquid portion was almost removed by decantation, and the precipitates were dried for 3 hours in a vacuum dryer to remove the residual solvent. The yield was about 13 g. The weight average molecular weight of the resin obtained, as determined by gel permeation chromatography, was about 2000 in terms of polystyrene equivalent molecular weight. Further, the absorbance of a film of this resin measured at a wavelength of 248 nm was about 18.0 per $\mu$m of film thickness. Moreover, the rate of dissolution of this resin film in an aqueous tetramethyl ammonium hydroxide solution (2.38%) was about 10 nm/sec.

SYNTHESIS EXAMPLE 5

After 14.42 g (0.1 mol) of 1-naphthol and 16.82 g (0.1 mol) of 2,6-bis(hydroxymethyl)-p-cresol were introduced into a 300 ml three-necked flask, 170 ml tetrahydrofuran was introduced into the flask and agitated and the mixture was dissolved. 1.75 g p-toluenesulfonic acid, hydrate, was weighed, and then dissolved in 10 ml tetrahydrofuran, and introduced into the flask which was then equipped with a reflux condenser, a thermometer and a nitrogen inlet tube. The flask was placed on an oil bath preset at 70° C., and the mixture was refluxed for 8 hours while being agitated and while nitrogen was introduced into it (about 10 cc/min.). At this time, the temperature in the reaction vessel was 64 to 68° C. After reflux for 8 hours, the reaction vessel was removed from the oil bath and air-cooled to room temperature in the same nitrogen atmosphere. The solution was transferred from the reaction vessel to a 500 ml evaporating flask and concentrated until its volume was reduced by almost half in an evaporator. At this time, the heating temperature in this evaporator was 45 to 50° C. The reaction solution thus concentrated was dissolved well in 200 ml ethyl acetate and transferred to a separatory funnel and washed 6 times with about 20% saline solution (200 ml for each washing) and then once with distilled water (200 ml for washing). When the wash became almost neutral, about 100 g sodium sulfate (anhydrate) was introduced into a 500 ml beaker and the ethyl acetate solution in the separatory funnel was transferred to the beaker and left for 2 to 3 hours and dried. The sodium sulfate used in drying was filtered off and the rinsed with ethyl acetate. All the ethyl acetate solutions were combined (about 200 to 300 ml) and transferred to a 500 ml evaporating flask and concentrated until its volume was reduced to almost 100 ml in an evaporator. At this time, the heating temperature in this evaporator was 40 to 45° C. 300 ml hexane was introduced into a 500 ml beaker into which the concentrated ethyl acetate solution was poured while being agitated well, and so the precipitates thereof were formed. The liquid portion was almost removed by decantation, and the precipitates were dried for 3 hours in a vacuum dryer to remove the residual solvent. At this time, heating was not performed. The yield was about 18 g. The weight average molecular weight of the resultant resin, as determined by gel permeation chromatography, was about 1800 in terms of polystyrene equivalent molecular weight. Further, the absorbance of a film of this resin measured at a wavelength of 248 nm was about 10.6 per $\mu$m of film thickness. The rate of dissolution of this resin film in an aqueous tetramethyl ammonium hydroxide solution (2.38%) was about 4.2 nm/sec.

SYNTHESIS EXAMPLE 6

After 6.02 g (0.1 mol) of 1,5-dihydroxynaphthalene, 15.98 g (0.095 mol) of 2,6-bis(hydroxymethyl)-p-cresol were introduced into a 300 ml three-necked flask, 170 ml tetrahydrofuran was introduced into the flask and agitated and the mixture was dissolved. 1.2 g of p-toluenesulfonic acid, hydrate, was weighed, and then dissolved in 10 ml tetrahydrofuran, and introduced into the above-mentioned flask which was then equipped with a reflux condenser, a thermometer and a nitrogen inlet tube. The flask was placed on an oil bath preset at 70° C., and the mixture was refluxed for 6 hours while being agitated and while nitrogen was introduced into it (about 10 cc/min.). At this time, the temperature in the reaction vessel was 64 to 68° C. After reflux for 8 hours, the reaction vessel was removed from the oil bath and air-cooled to room temperature in the same nitrogen atmosphere. The solution was transferred from the reaction vessel to a 500 ml evaporating flask and concentrated until its volume was reduced by almost half in an evaporator. At this time, the heating temperature in the evaporator was 45 to 50° C. The reaction solution thus concentrated was dissolved well in 200 ml ethyl acetate, transferred to a separatory funnel and washed 4 times with distilled water (200 ml for each washing). By washing 4 times, the wash became almost neutral. About 100 g sodium sulfate (anhydrate) was introduced into a 500 ml beaker, and the ethyl acetate solution in the separatory funnel was transferred to the beaker and left for 2 to 3 hours and dried. The sodium sulfate used in drying was filtered off and further rinsed with ethyl acetate. All the ethyl acetate solutions were combined (about 200 to 300 ml), and transferred to a 500 ml evaporating flask, and concentrated until its volume was reduced to almost 100 ml in an evaporator. At this time, the heating temperature in this evaporator was 40 to 45° C. 300 ml hexane was introduced into a 500 ml beaker into which the concentrated ethyl acetate solution was poured while being agitated well, and so the precipitates thereof were formed. The liquid portion was almost removed by decantation, and the precipitates were dried for 3 hours in a vacuum dryer to remove the residual solvent. At this time, heating was not performed. The yield was about 16 g. The weight average molecular weight of the resultant resin, as determined by gel permeation chromatography, was about 4200 in terms of polystyrene equivalent molecular weight. Further, the absorbance of a film of this resin measured at a wavelength of 248 nm was about 6.5 per $\mu$m of film thickness. Moreover, the rate of dissolution of this resin film in an aqueous tetramethyl ammonium hydroxide solution (2.38%) was about 140 nm/sec.

SYNTHESIS EXAMPLE 7

A resin was obtained in the same manner as in Synthesis Example 6 except the fact that 2,3-dihydroxynaphthalene was used in place of 1,5-dihydroxynaphthalene of Synthesis Example 6. The weight average molecular weight of the resin obtained, as determined by gel permeation chromatography, was about 1200 in terms of polystyrene equivalent molecular weight. Further, the absorbance of a film of this resin measured at a wavelength of 248 nm was 9.7 per $\mu$m of film thickness. Moreover, the rate of dissolution of this resin film in an aqueous tetramethyl ammonium hydroxide solution (2.38%) was about 15 nm/sec.

SYNTHESIS EXAMPLE 8

A resin was obtained in the same manner as in Synthesis Example 6 except the fact that 1,6-dihydroxynaphthalene was used in place of 1,5-dihydroxynaphthalene of Synthesis Example 6. The weight average molecular weight of the resin obtained, as determined by gel permeation chromatography, was about 1400 in terms of polystyrene equivalent molecular weight. Further, the absorbance of a film of this resin measured at a wavelength of 248 nm was 15.1 per $\mu$m of film thickness. Moreover, the rate of dissolution of this resin film in an aqueous tetramethyl ammonium hydroxide solution (2.38%) was about 160 nm/sec.

SYNTHESIS EXAMPLE 9

A resin was obtained in the same manner as in Synthesis Example 6 except the fact that 1,4-dihydroxynaphthalene was used in place of 1,5-dihydroxynaphthalene of Synthesis Example 6. The weight average molecular weight of the resin obtained, as determined by gel permeation chromatography, was about 1000 in terms of polystyrene equivalent molecular weight. Further, the absorbance of a film of this resin measured at a wavelength of 248 nm was 11.4 per $\mu$m of film thickness. Moreover, the rate of dissolution of this resin film in an aqueous tetramethyl ammonium hydroxide solution (2.38%) was about 100 nm/sec.

SYNTHESIS EXAMPLE 10

A resin was obtained in the same manner as in Synthesis Example 6 except the fact that 1,7-dihydroxynaphthalene was used in place of 1,5-dihydroxynaphthalene of Synthesis Example 6. The weight average molecular weight of the resin obataind, as determined by gel permeation chromatography, was about 3200 in terms of polystyrene equivalent molecular weight. The absorbance of a film of this resin measured at a wavelength of 248 nm was 10.2 per $\mu$m of film thickness. The rate of dissolution of this resin film in an aqueous tetramethyl ammonium hydroxide solution (2.38%) was about 120 nm/sec.

SYNTHESIS EXAMPLE 11

After 7.12 g (0.05 mol) of 1-naphthol, 8.01 g (0.05 mol) of 1,6-dihydroxynaphthalene and 15.98 g (0.095 mol) of 2,6-bis(hydroxymethyl)-p-cresol were introduced into a 300 ml three-necked flask, 170 ml tetrahydrofuran was introduced into the flask and agitated and the mixture was dissolved. 1.2 g of p-toluenesulfonic acid, hydrate, was weighed, and dissolved in 10 ml tetrahydrofuran, and introduced into the above-mentioned flask which was equipped with a reflux condenser, a thermometer and a nitrogen inlet tube. The flask was placed on an oil bath preset at 70° C., and the mixture was refluxed for 8 hours while being agitated and while nitrogen was introduced into it (about 10 cc/min.). At this time, the temperature in the reaction vessel was 64 to 68° C. After reflux for 8 hours, the reaction vessel was removed from the oil bath and air-cooled to room temperature in the same nitrogen atmosphere. The solution was transferred from the reaction vessel to a 500 ml evaporating flask and concentrated until its volume was reduced by almost half in an evaporator. At this time, the heating temperature in the evaporator was 45 to 50° C. The reaction solution thus concentrated was dissolved well in 200 ml ethyl acetate, and then transferred to a separatory funnel, and washed 4 times with distilled water (200 ml for each washing). By washing 4 times, the wash became almost neutral. About 10 ng sodium sulfate (anhydrate) was introduced into a 500 ml beaker, and the ethyl acetate solution in the separatory funnel was transferred to the beaker and left for 2 to 3 hours and dried. The sodium sulfate used in drying was filtered off and rinsed with ethyl acetate. All the ethyl acetate solutions were combined (about 200 to 300 ml) and transferred to a 500 ml evaporating flask and concentrated until its volume was reduced to almost 100 ml in an evaporator. At this time, the heating temperature in this evaporator was 40 to 45° C. 300 ml hexane was introduced into a 500 ml beaker into which the concentrated ethyl acetate solution was poured while being agitated, and so the precipitates thereof were formed. The liquid portion was almost removed by decantation, and then the precipitates were dried for 3 hours in a vacuum dryer to remove the residual solvent. At this time, heating was not performed. The yield was 28 to 29 g. The weight average molecular weight of the resin obtained, as determined by gel permeation chromatography, was about 3000 in terms of polystyrene equivalent molecular weight. The absorbance of a film of this resin measured at a wavelength of 248 nm was 9.4 per $\mu$m of film thickness. The rate of dissolution of this resin film in an aqueous tetramethyl ammonium hydroxide solution (2.38%) was about 130 nm/sec.

SYNTHESIS EXAMPLE 12

5.3 g (0.0050 mol) of a phenol compound TPPA-1000P (Honshu Chemical Industry) and 4.7 g (0.025 mol) of 2-hydroxy-3-naphthoic acid were introduced into a 300 ml three-necked Erlenmeyer flask and dissolved in 100 ml tetrahydrofuran. 5.65 g (0.0275 mol) of N,N'-dicyclohexylcarbodiimide and 0.37 g (0.0025 mol) of 4-pyrrolidinopyridine were added thereto, and thereafter the flask was sealed and the mixture was agitated at room temperature for 18 hours. As the reaction proceeded, dicylohexyl urea of a by-product precipitated as a white precipitate. After the reaction, 200 ml ethyl acetate was added thereto and the reaction solution was agitated and then the precipitates were filtered off. The filtrate was washed 4 times with 100 ml water and then dried with sodium sulfate. A few hours later, the sodium sulfate used in the drying was filtered off and the solvent was distilled from the filtrate under a reduced pressure, whereby solids were obtained. The obtained solids were dissolved again in 150 ml ethyl acetate, and dicyclohexyl urea remaining as an insoluble was filtered off. Then, the solvent was distilled under a reduced pressure, and the precipitated solids were dissolved again in ethyl acetate, and then this procedure was repeated further twice in order to filter off the remaining insoluble dicyclohexyl urea. Next, to completely remove the dicylohexyl urea of the by-product, the ethyl acetate solution containing the desired resin was applied onto a column of an about 10 cm silica gel (Wakogel$^{RT}$ C-300). The eluate flowing from the column was concentrated and then re-precipitated with 300 ml n-hexane. The precipitates were collected by filtration and dried to obtain a 6.0 g 2-hydroxy-3-naphthoic acid ester of phenolic resin with a yellow powdery form. 1.0 g of the obtained resin was dissolved in 6.0 g propylene glycol monomethylether acetate to prepare a resin solution. The prepared resin solution was spin-coated onto a quartz plate and baked on a baking plate at 100° C. for 2 minutes to obtain a resin film. When an UV absorption spectrum of this resin film was measured, the absorbance of 1.0 $\mu$m film at 248 nm was 7.6. Further, this resin film was irradiated with 1 J/cm$^2$ light from a Xe—Hg lamp via an interference filter permitting 250 nm light to pass therethrough, whereby the UV absorption spectrum thereof was measured. As a result, it was found that the absorbance of 7.6 remained unchanged and the film was excellent in light resistance. Further, using the above-mentioned resin solution, a film of 550 nm in thickness was formed on a silicon substrate and measured for its dissolution time in NMD-3 (2.38%). The measured results indicated that the film was dissolved completely in 3.2 seconds and the remaining film became 0. The rate of dissolution of the film was found to be 170 nm/sec.

SYNTHESIS EXAMPLE 13

10 g of the resin obtained in Synthesis Example 4 and 100 ml tetrahydrofuran were introduced into a 500 ml three-necked flask equipped with a reflux condenser, a nitrogen inlet tube and a dropping funnel, and was agitated and dissolved. The reaction vessel flask was equipped with a reflux condenser and a nitrogen inlet tube, and while the agitating was executed, a previously made solution of 6.7 g t-butoxide potassium in 80 ml tetrahydrofuran was introduced into the resin solution. Then, a previously made solution of 13.1 g di-t-butyl dicarbonate in 80 ml tetrahydrofuran was dripped into the reaction vessel for about 1 hour by using the dropping funnel. Meantime, the agitating and the introduction of nitrogen were continued. After the agitating was executed for a further 1 hour, the reaction vessel was sealed and left overnight. About 300 ml iced water was placed in a 500 ml beaker, and the reaction solution was poured into this beaker. The whole solution was transferred into a 1000 ml separatory funnel and then extracted with 200 ml ethyl acetate. The obtained ethyl acetate extract was washed with water, dried with sodium sulfate, filtered off, and thereafter poured into a large amount of hexane to form precipitates. The precipitates were separated by filtration and dried, whereby about 6.0 g of a partially t-butoxycarbonyl protected resin in a black powdery form was obtained. Further, the absorbance of a film of this resin, measured at a wavelength of 248 nm, was about 16 per $\mu$m of film thickness. Moreover, the rate of dissolution of this resin film in an aqueous tetramethyl ammonium hydroxide solution (2.38%) was about 0.02 nm/sec.

SYNTHESIS EXAMPLE 14

10 g of the resin obtained in Synthesis Example 4 and 200 ml tetrahydrofuran were introduced into a 500 ml flask, agitated well and dissolved. 0.8 g of 60% sodium hydride dispersion in oil was washed with a small amount of tetrahydrofuran, and slowly added together with a small amount of tetrahydrofuran into the flask. Thereafter, the resin solution was agitated at a room temperature for 1 hour in the unsealed flask. 3.9 g bromoacetic acid t-butyl ester was poured into the flask, and 0.1 g ammonium bromide dissolved in a small amount of tetrahydrofuran was added into the flask. Thereafter, the flask was equipped with a reflux condenser and placed on an oil bath preset at 70° C. The mixture was refluxed for 7 hours while being agitated. The reaction solution was poured into 1-liter water, transferred to a separatory funnel, and extracted with 200 ml ethyl acetate. The reaction solution was washed repeatedly with distilled water until the wash became almost neutral. Then the reaction solution was dried over sodium sulfate, separated by filtration, thereafter concentrated in an evaporator, and poured into 300 ml hexane to obtain precipitates. The liquid portion was almost removed by decantation, and then the precipitates were dried for 3 hours in a vacuum dryer to remove the residual solvent. The yield was about 8 g. The weight average molecular weight of the resin obtained, as determined by gel permeation chromatography, was about 2500 in terms of polystyrene equivalent molecular weight. Further, the absorbance of a film of this resin measured at a wavelength of 248 nm was about 16 per $\mu$m of film thickness. Moreover, the rate of dissolution of this resin film in an aqueous tetramethyl ammonium hydroxide solution (2.38%) was about 0.01 nm/sec.

SYNTHESIS EXAMPLE 15

When the resin in Synthesis Example 5 was employed instead of the resin in Synthesis Example 4 used as the raw material in Synthesis Example 14, a resin, in which an absorbance measured at a wavelength of 248 nm was about 8 per $\mu$m of film thickness and a rate of the dissolution thereof in an aqueous tetramethyl ammonium hydroxide solution (2.38%) was about 0.01 nm/sec. or less, was obtained.

SYNTHESIS EXAMPLE 16

When the resin in Synthesis Example 7 was employed instead of the resin in Synthesis Example 4 used as the raw material in Synthesis Example 14, a resin, in which an absorbance measured at a wavelength of 248 nm was about 7.5 per $\mu$m of film thickness and a rate of the dissolution thereof in an aqueous tetramethyl ammonium hydroxide solution (2.38%) was about 0.01 nm/sec. or less, was obtained.

SYNTHESIS EXAMPLE 17

When the resin in Synthesis Example 12 was employed instead of the resin in Synthesis Example 4 used as the raw material in Synthesis Example 14, a resin, in which an absorbance measured at a wavelength of 248 nm was about 5.7 per $\mu$m of film thickness and a rate of the dissolution thereof in an aqueous tetramethyl ammonium hydroxide solution (2.38%) was about 0.01 nm/sec. or less, was obtained.

RADIATION SENSITIVE RESIST EXAMPLE 1

100 parts by weight of the resin in Synthesis Example 1, 20 parts by weight of 1,3,5-tris(2-hydroxy-2-propyl)benzene as a precursor of dissolution inhibitor, and 10 parts by weight of triphenylsulfonium trifluoromethanesulfonate as an acid generator were dissolved in 900 parts by weight of 1-methoxy-2-propanol. A small amount of surfactant was further added for prevention of striation, and then the mixture was filtered through a fluorinated membrane filter having a pore diameter of 0.2 $\mu$m to prepare a solution of a negative-working radiation sensitive resist. This solution was dripped on a quartz wafer, spin-coated thereon, and thereafter heat-treated at 100° C. for 2 minutes to obtain a film of 0.35 $\mu$m in thickness. Further, a commercial water soluble charge-up suppressor Espacer$^{RT}$ 100 (Showa Denko, K. K.) was applied as an antistatic film, and a test pattern was drafted by an electron beam drafting device (accelerating voltage of electron beam is 50 kV). Thereafter, the film was heat-treated at 80° C. for 2 minutes and developed for 60 seconds with using an aqueous tetramethyl ammonium hydroxide solution (2.38%) as a developer, whereby an excellent negative-working pattern with 0.25 $\mu$m line/space was obtained with 8.0 $\mu$C/cm$^2$ of an electron beam irradiation amount. Further, the absorbance of this negative-working radiation sensitive resist film, measured at a wavelength of 248 nm, was 11 per $\mu$m of film thickness.

RADIATION SENSITIVE RESIST EXAMPLES 2 to 4

When the resins in Synthesis Examples 2 to 4 were used instead of the resin in Synthesis Example 1, negative-working radiation sensitive resists each having almost similar performance were obtained.

RADIATION SENSITIVE RESIST EXAMPLE 5

100 parts by weight of the resin in Synthesis Example 11, 20 parts by weight of 1,3,5-tris(2-hydroxy-2-propyl)benzene as a precursor of dissolution inhibitor, and 10 parts by weight of triphenylsulfonium trifluoromethanesulfonate as an acid generator were dissolved in 900 parts by weight of 1-methoxy-2-propanol. A small amount of surfactant was further added for prevention of striation, and thereafter the mixture was filtered through a fluorinated membrane filter having a pore diameter of 0.2 $\mu$m to prepare a solution of a negative-working radiation sensitive resist. This solution was dripped on a quartz wafer, spin-coated thereon, and then heat-treated at 100° C. for 2 minutes to obtain a film of 0.65 $\mu$m in thickness. Further, a commercial water soluble charge-up suppressor Espacer$_{RT}$ 100 (Showa Denko, K. K.) was applied as an antistatic film, and a test pattern was drafted by an electron beam drafting device (accelerating voltage of electron beam is 50 kV). Thereafter, the film was heat-treated at 80° C. for 2 minutes and developed for 60 seconds with using an aqueous tetramethyl ammonium hydroxide solution (2.38%) as a developer, whereby an excellent negative-working pattern having 0.35 $\mu$m line/space was obtained with 20.0 $\mu$C/cm$^2$ of an electron beam irradiation amount. Moreover, the absorbance of this negative-working radiation sensitive resist film, measured at a wavelength of 248 nm, was 6.2 per $\mu$m of film thickness.

RADIATION SENSITIVE RESIST EXAMPLE 6

100 parts by weight of the resin in Synthesis Example 12, 10 parts by weight of hexamethoxymethylmelamine as an acid-crosslinker, and 10 parts by weight of tris(2,3-dibromopropyl)isocyanurate as an acid generator were dissolved in 900 parts by weight of 1-methoxy-2-propanol. A small amount of surfactant was further added for prevention of striation, and then the mixture was filtered through a fluorinated membrane filter having a pore diameter of 0.2 $\mu$m to prepare a solution of a negative-working radiation sensitive resist. This solution was dripped on a quartz wafer, spin-coated thereon, and then heat-treated at 100° C. for 2 minutes to obtain a film of 0.55 $\mu$m in thickness. Further, a commercial water soluble charge-up suppressor Espacer$^{RT}$ 100 (Showa Denko, K. K.) was applied as an antistatic film, and a test pattern was drafted by an electron beam drafting device (accelerating voltage of electron beam is 50 kV). Thereafter, the film was heat-treated at 100° C. for 2 minutes and developed for 60 seconds with using an aqueous tetramethyl ammonium hydroxide solution (2.38%) as a developer, whereby an excellent negative-working pattern having 0.35 $\mu$m line/space was obtained with 22.0 $\mu$C/cm$^2$ of an electron beam irradiation amount. Moreover, the absorbance of this negative-working radiation sensitive resist film, measured at a wavelength of 248 nm, was 5.4 per $\mu$m of film thickness.

RADIATION SENSITIVE RESIST EXAMPLE 7

100 parts by weight of the resin in Synthesis Example 13 and 5 parts by weight of triphenylsulfonium trifluoromethanesulfonate as an acid generator were dissolved in 900 parts by weight of propylene glycol 1-monomethylether acetate. A small amount of surfactant was further added for prevention of striation, and thereafter the mixture was filtered through a fluorinated membrane filter having a pore diameter of 0.2 $\mu$m to prepare a solution of a positive-working radiation sensitive resist. This solution was dripped on a quartz wafer, spin-coated thereon, and then heat-treated at 100° C. for 2 minutes to obtain a film of 0.35 $\mu$m in thickness. Further, a commercial water soluble charge-up suppressor Espacer$^{RT}$ 100 (Showa Denko, K. K.) was applied as an antistatic film, and a test pattern was drafted by an electron beam drafting device (accelerating voltage of electron beam is 50 kV). Thereafter, the film was heat-treated at 100° C. for 2 minutes and developed for 60 seconds with using an aqueous tetramethyl ammonium hydroxide solution (2.38%) as a developer, whereby an excellent positive-working pattern having 0.35 $\mu$m holes was obtained with 10.0 $\mu$C/cm$^2$ of an electron beam irradiation amount. Moreover, the absorbance of this positive-working radiation sensitive resist film, measured at a wavelength of 248 nm, was 9.5 per $\mu$m of film thickness.

RADIATION SENSITIVE RESIST EXAMPLES 8 to 11

In Radiation Sensitive Resist Example 7, when the resins in Synthesis Examples 14 to 17 were used instead of the resin in Synthesis Example 13, positive-working radiation sensitive resists each having almost similar sensitivity and resolution performance were obtained. The absorbance at a wavelength of 248 nm measured was 9.5, 6.7, 5.5 and 4.7, respectively.

(Embodiment 1)

An example of the method of manufacturing the photo mask for KrF excimer laser lithography using, as an electron beam resist, the negative-working radiation sensitive resist prepared in each of Radiation Sensitive Resist Examples 1 to 6 will be described by reference to the drawings.

An outline of mask production by etching will be described by comparing a chrome light shielding film photo mask with a resist light shielding film photo mask. FIGS. 2A to 2D are cross-sectional views showing an outline of the manufacturing steps of the resist light shielding film photo mask, and FIGS. 3A to 3F are cross-sectional views showing an outline of the manufacturing steps of the chrome light shielding film photo mask.

Figure 3A:
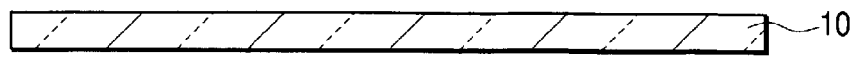
FIG. 3A is a cross-sectional drawing showing an outline of the method of manufacturing a chrome light shielding film photo mask.

First, the manufacturing steps of the chrome light shielding film photo mask will be described. FIG. 3A shows a quartz substrate 10 and a light shielding film 11 formed by sputtering on the quartz substrate 10. The light shielding film 11 comprises an about 80 nm thick chrome film and an about 20 nm thick chrome oxide film laminated thereon as an antistatic film.

Figure 3B:
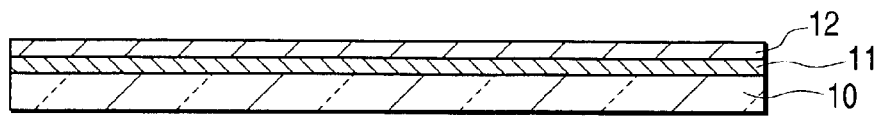
FIG. 3B is a cross-sectional drawing showing an outline of the method of manufacturing a chrome light shielding film photo mask.

Then, as shown in FIG. 3B, a photo resist film 12 is applied onto the light shielding film 11 by a spin-coating method. As the photo resist film 12, a commercial chemical amplification negative-working electron beam resist "NEB22A" (Sumitomo Chemical Co., Ltd.) has been used. Thereafter, the pre-baking is performed at 120° C. for the purpose of evaporation of the solvent in the photo resist film 12. After the pre-baking, the thickness of the photo resist film 12 is 350 nm.

Figure 3C:
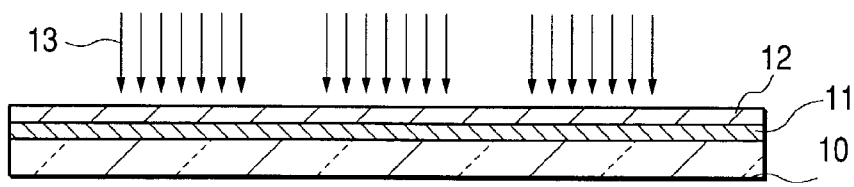
FIG. 3C is a cross-sectional drawing showing an outline of the method of manufacturing a chrome light shielding film photo mask.

Then, as shown in FIG. 3C, the photo resist film 12 is irradiated by an electron beam 13 in accordance with drafting data of an electron beam drafting device. After the drafting, the baking called PEB is performed at 100° C.

Figure 3D:
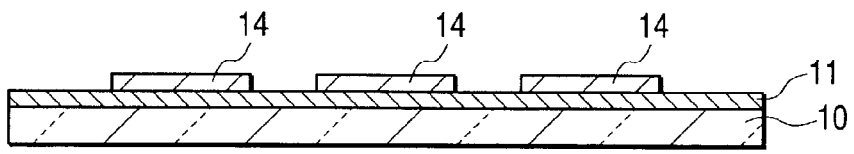
FIG. 3D is a cross-sectional drawing showing an outline of the method of manufacturing a chrome light shielding film photo mask.

Then, the photo resist film 12 is developed with an aqueous alkali solution, and, as a result, the photo resist film 12 in the portion irradiated by the electron beam 13 is insolubilized to form resist patterns 14 on the light shielding film 11, as shown in FIG. 3D. After development, the baking called the post-baking is performed at 110° C.

Figure 3E:
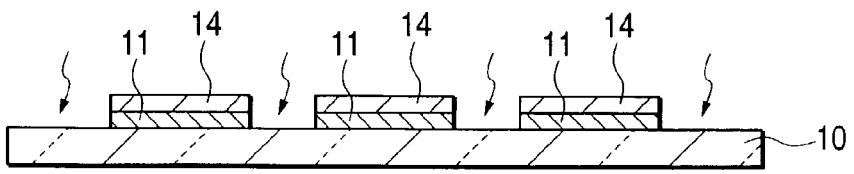
FIG. 3E is a cross-sectional drawing showing an outline of the method of manufacturing a chrome light shielding film photo mask.

Then, the light shielding film 11 is dry-etched with using the resist patterns 14 as a mask to remove the light shielding film 11 from the regions (shown by arrows) not covered with the resist patterns 14, as shown in FIG. 3E. The etching of the light shielding film 11 is performed by a reactive ion etching method using a mixed gas of chlorine and oxygen.

Figure 3F:
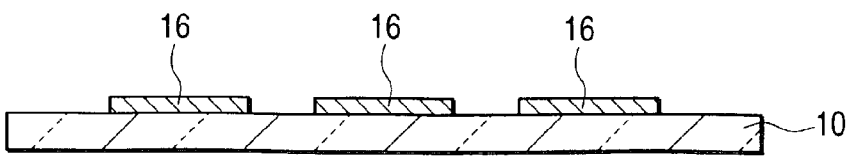
FIG. 3F is a cross-sectional drawing showing an outline of the method of manufacturing a chrome light shielding film photo mask.

Then, the resist patterns 14 are removed by plasma-ashing with an oxygen gas. Thereafter, the photo mask having chrome patterns 16 as a light shielding film, as shown in FIG. 3F, is obtained through the washing step of an aqueous solution of sulfuric acid and the drying step. Then, the photo mask is completed through CD measurement, pattern inspection, correction step, and final washing step.

Figure 2A:
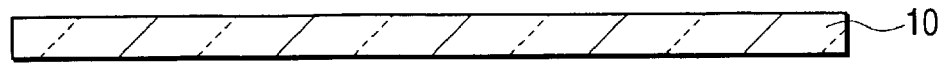
FIG. 2A is a cross-sectional view showing an outline of the method of manufacturing a resist light shielding film photo mask.
Figure 2B:
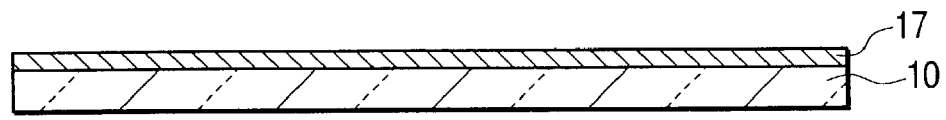
FIG. 2B is a cross-sectional view showing an outline of the method of manufacturing a resist light shielding film photo mask.

Next, the manufacturing step of the resist light shielding film photo mask will be described. First, as shown in FIG. 2A, a quartz substrate 10, on which a light shielding film made of chromium or the like is not formed, is prepared. Then, as shown in FIG. 2B, a photo resist film 17 is directly coated on the quartz substrate 10. In this step, the negative-working radiation sensitive resist prepared in Radiation Sensitive Resist Example 1 has been used as an negative-working electron beam resist.

Figure 2C:
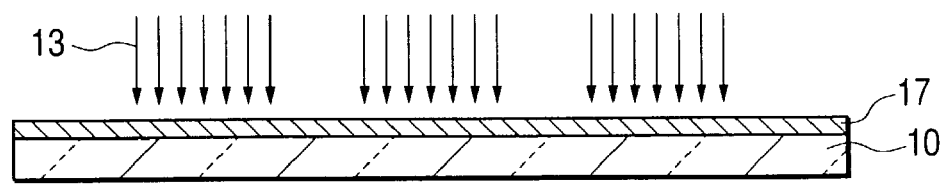
FIG. 2C is a cross-sectional view showing an outline of the method of manufacturing a resist light shielding film photo mask.

Next, as shown in FIG. 2C, the photo resist film 17 is irradiated by an electron beam 13 in accordance with drafting data of an electron beam drafting device. It is noted that a coating film for antistatic agent is applied and peeled off before and after the drafting.

Figure 2D:
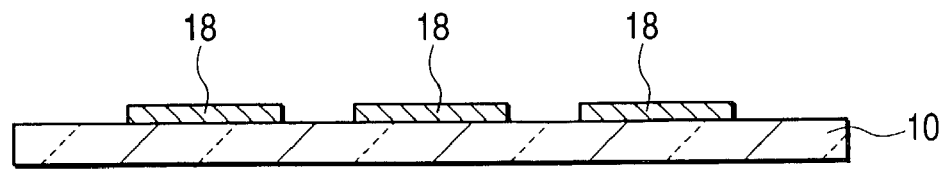
FIG. 2D is a cross-sectional view showing an outline of the method of manufacturing a resist light shielding film photo mask.

Then, as a result of development of the photoresist film 17 with an aqueous alkali solution, as shown in FIG. 2D, the photoresist film 17 of the portions irradiated with the electron beam 13 is insolubilized, whereby the photo mask having the resist pattern 18 as the light shielding film is obtained. Thereafter, the photo mask is completed through CD measurement, pattern inspection, correction step, and final washing step.

As is evident from the comparison between FIGS. 2A to 2D and FIGS. 3A to 3F, in the KrF excimer laser photo mask of the present invention, the steps of etching and transferring a resist pattern onto the chrome light shielding film are not required. Accordingly, the mask production time can be reduced and also the occurrence of defects becomes small. Further, because the dimensional accuracy thereof does not deteriorate due to the etching, even if a circuit pattern particularly requires the mask pattern with high accuracy, the accuracy on the surface of the mask is high and the rough and fine pattern density of each dimension and the dependence on each pattern dimension are also small. So, it is possible to produce the true photo mask to design.

Figure 5A:
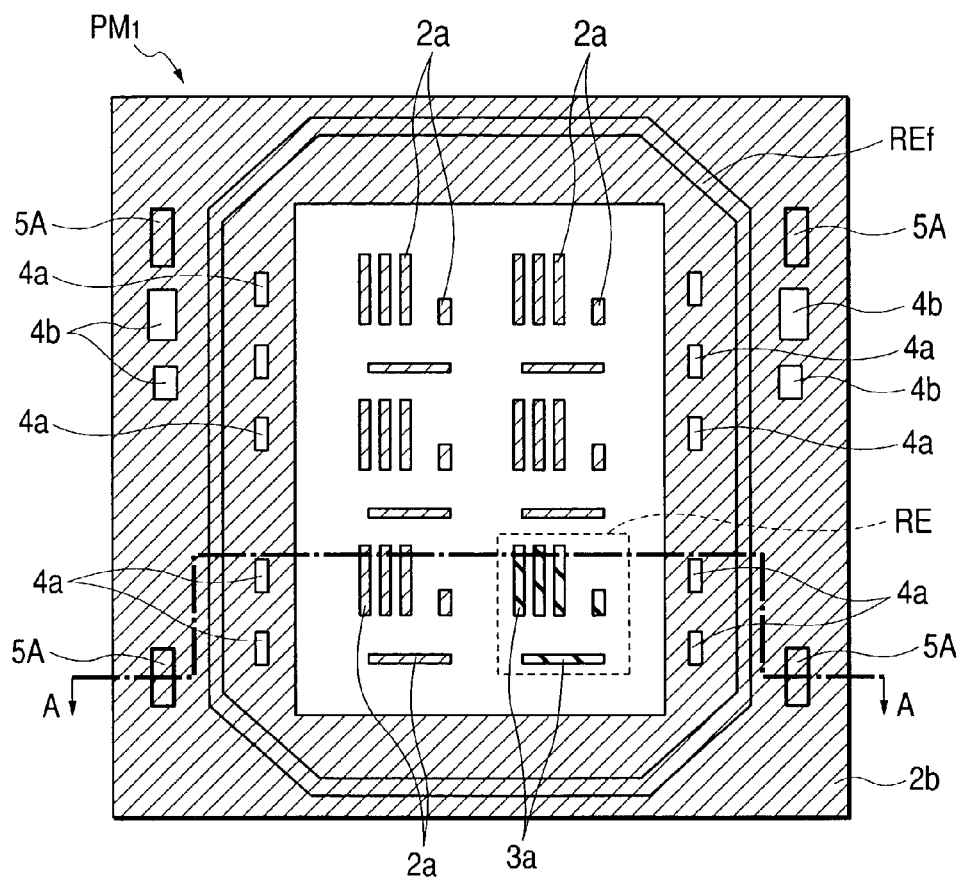
FIG. 5A is a plan view showing one example of a photo mask for KrF excimer laser according to the present invention.
Figure 5B:
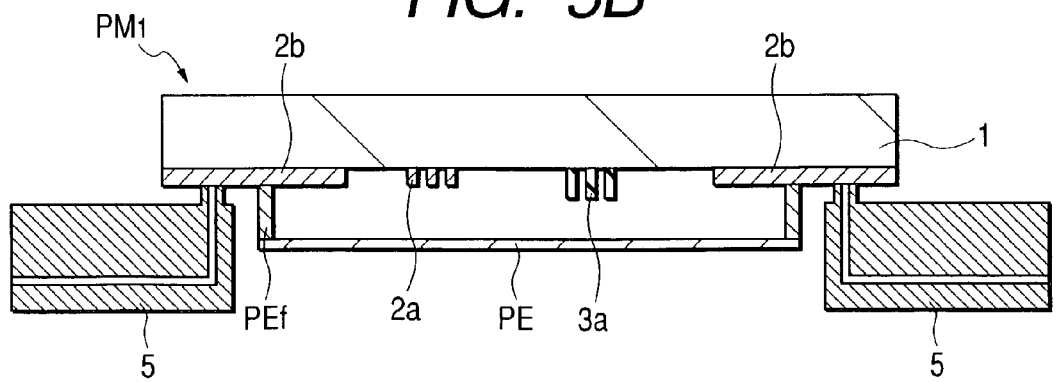
FIG. 5B is a cross-sectional view taken along line A—A in FIG. 5A, showing the state of mounting this photo mask to a KrF excimer laser stepper.

FIG. 5A is a plan view showing one example of a photo mask for KrF excimer laser according to the present invention, and FIG. 5B is a cross-sectional view taken along line A—A of FIG. 5A, showing the state of mounting the photo mask to a KrF excimer laser stepper.

The mask PM1 is a reticle for: forming, through a reduction projection optics or the like, an image having a dimension, for example, 1 to 10 times smaller than an original dimension of an original picture of an integrated circuit pattern; and transferring the image onto the wafer. FIG. 5 shows a mask having a light shielding portion forming around a semiconductor chip, wherein a positive-working resist film is used on the wafer to form a line pattern.

A mask substrate 1 for this mask PM1 is made of a transparent quartz substrate of about 6 mm in thickness, which is formed in e.g. a flat square. In the center of the principal surface of the mask substrate 1, a flat rectangular light-transmitting open region is formed to expose the principal surface of the mask substrate 1. This light-transmitting open region forms a region of the above-mentioned integrated circuit pattern. In the integrated circuit pattern region, light shielding patterns 2a and 3a for transferring the integrated circuit patterns onto the wafer are arranged on the principal surface of the mask substrate 1. The case of transferring the light shielding patterns 2a and 3a as line patterns on the wafer is shown in this drawing.

The above-mentioned light shielding pattern 2a is composed of a metal film made of Cr or the like similarly to the ordinary photo masks. However, the light shielding pattern 3a in a region RE (region shown in the broken lines) of a part of the integrated circuit pattern region is composed of the resist film of the present invention.

The region in the approximately octagonal frame on the light shielding pattern 2b indicates the above-mentioned pellicle cover area. That is, in this case, it is illustrated that a pellicle PE is joined via a pellicle-attached frame PEf to the principal surface side of the mask substrate 1 in the mask PM1. The pellicle PE is a structure having a transparent protective film, and is provided on the principal surface of the mask substrate 1 or provided a predetermined distance apart from the principal surface and the back thereof in order to prevent foreign matters from adhering to the mask PM1. This predetermined distance is designed in consideration of foreign matters adhering to the surface of the protective film and of transferability of the foreign matters to the wafer.

The base of the pellicle-attached flame PEf is joined and fixed in such a state as to contact directly with the light shielding pattern 2b of the mask PM1. This can prevent the pellicle-attached frame PEf from being removed. Further, if the resist film is formed at the position to which the pellicle-attached flame PEf is attached, the resist film is peeled off when the pellicle PE is attached or removed. So, this is the cause of foreign matter occurrence. The pellicle-attached frame PEf is joined in such a state as to contact directly with the light shielding pattern 2b, whereby occurrence of such foreign matters can be prevented.

The region excluding the integrated circuit pattern region in the pellicle cover region is an integrated circuit pattern peripheral region. In the integrated circuit pattern peripheral region, mark patterns 4a for detection of information on the mask PM1 are formed. The outside of the pellicle cover region indicates a peripheral region. In this peripheral region, mark patterns 4b for detection of information of the mask PM1 are formed. The mark patterns 4b are used as, for example, alignment marks or proofreading marks used in the mask production or the like. Each alignment mark is a mark for executing the alignment of the mask PM1 with an inspection device or a stepper by detecting the position of the mask PM1 when the photo mask PM1 is attached to the inspection device or stepper. Further, each proofreading mark is a mark used for measurement of patterning deviation, pattern shapes and conditions, or pattern transfer accuracy.

The mask MP1 is mounted to the inspection device, the exposure device or the like, in such a state that each holder 5 for the above-mentioned inspection device or stepper contacts directly with the light shielding pattern 2b of the mask MP1. Each region 5A shown in the thick frames of FIG. 5A illustrates a region with which each holder 5 is contacted. It is noted that each holder 5 having a vacuum adsorption mechanism is exemplified herein.

(Embodiment 2)

A negative-working radiation sensitive resist, using diphenyliodonium trifluoromethanesulfonate in place of triphenylphosphonium trifluoromethanesulfonate as an acid generator in Radiation Sensitive Resist Example 1, has been employed. In the steps of FIGS. 2A to 2D, a laser drafting technique, using as a light source an Ar ion laser with the 363.8 nm wavelength employed in the production of ordinary photo masks instead of an electron beam, has been utilized, whereby a resist light shielding film photo mask for KrF excimer laser has been produced. Laser drafting has advantages of the fact that none of the problems of charge-up occurs and the problems of heat accumulation in the drafting are difficult to cause. Accordingly, it is not necessary to form a special electroconductive film in the case of laser drafting. When the resist light shielding film photo mask for KrF excimer laser, manufactured by laser drafting with Ar ions, is applied to the processing of a circuit layer in a semiconductor integrated circuit device similarly to Embodiment 1, the positive-working resist pattern on the wafer has almost the same qualities in comparison with one applying the ordinary photo mask. Additionally, the production costs and production time can be significantly reduced in comparison with one applying to the photo mask, all layers of which are formed by a chrome light shielding film.

One example of producing a semiconductor integrated device by using the photo mask of the present invention is as follows: A KrF lithography technique, using a photo mask with an ordinary chrome light shielding pattern produced in accordance with the process in FIGS. 3A to 3F, is applied until the gate processing step; and then the resist light shielding film photo mask prepared in the steps of FIGS. 2A to 2D is applied in processing an upper circuit layer. Further, a resist light shielding film photo mask for hole pattern, produced by using the positive-working electron beam resist prepared in accordance with Radiation Sensitive Resist Example 4 instead of the negative-working electron beam resist employed in the steps of FIGS. 2A to 2D, is applied in processing a through-hole layer between circuit layers.

The configurative view for applying the basic resist light shielding film photo mask of the present invention is shown in FIG. 1. The produced photo mask has a pellicle mounted for protecting the light shielding pattern-forming surface similarly to that of the ordinary photo mask and is mounted to a KrF excimer laser stepper having a numerical aperture (NA) of 0.6 and a contraction coefficient of ⅕, and a predetermined circuit pattern formed on the photo mask is transferred onto a commercial positive-working resist for KrF, applied onto a semiconductor wafer. The KrF laser light 105 from the light source of a KrF excimer laser penetrates the quartz substrate 10 of the photo mask having the KrF laser light shielding resist pattern 18, and exposes via a projection optics 104 the commercial KrF resist 103 formed at the upper layer of a film to be processed 102 on the silicon wafer 101. After development, the positive-working resist pattern for KrF on the film to be processed has almost the same qualities in comparison with one produced by the ordinary photo mask. Concerning various kinds of devices that have common layers until the gate layer and are different in specifications of the circuit layers, the photo mask having the resist light shielding patterns prepared by the steps of FIGS. 2A to 2D is applied as a photo mask for the circuit layers. Therefore, in comparison with the case where all layers are produced by the photo mask having the ordinary chrome light shielding patterns prepared in accordance with the steps of FIGS. 3A to 3F, it is possible to significantly reduce the production costs and production time for one kind of device.

As described above, the invention(s) made by the present inventor(s) has been specifically explained on the basis of the embodiments, but is not limited to the above-mentioned embodiments and, needless to say, can be variously changed and modified without departing from the gist thereof.

Advantages obtained by representative ones among the inventions disclosed in the present application are, if being briefly described, as follows.

According to one preferable embodiment of the present invention, since a light shielding pattern on a photo mask for KrF lithography can be formed directly by a development treatment, the step of etching a light shielding film or/and the step of removing a photoresist film is unnecessary. Therefore, it is possible to achieve reduction in production costs of photo masks, improvement in dimensional accuracy and reduction in defects. Further, as occasion demands, the photo masks produced in a short time at low costs can be used, and so there are advantages or the fact that a small number of many kinds of semiconductor integrated circuit devices can be produced in a short time at lower costs.

What is claimed is:

1. A photo mask comprising a light shielding film of predetermined pattern, the light shielding film being form by forming the predetermined pattern from a radiation sensitive resist film formed on a photo mask substrate,
   wherein said radiation sensitive resist film includes, as a polymer matrix: an aqueous alkali-soluble resin in which a naphthol structure having at least one hydroxyl group bound to a naphthalene nucleus is incorporated as a photo-absorbent structure of a KrF excimer laser light; or a derivative of said aqueous alkali-soluble resin, said light shielding film shielding laser light radiating from a KrF excimer laser.

2. The photo mask according to claim 1,
   wherein said polymer matrix has a condensation polymer of naphthalene derivatives represented by the below general formula (1) with formaldehyde or hydroxynaphthaldehyde, and
   at lease 5% component of said naphthalene derivatives contains two hydroxyl or carboxyl groups as substituents,
   with formula (1) being:

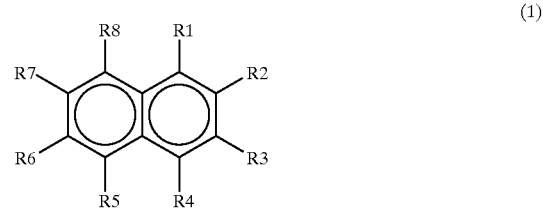

(1)

wherein R1 to R8 each represent an atom or an atomic group selected from the group consisting of a hydroxyl group, hydrogen, an alkyl group substituted or non-substituted with the carbon number of 1 to 4, halogen, a phenyl group, a methoxy group, an ethoxyethyl group, a cyclopropyl group, an acetyl group and a carboxyl group, and R1 to R8 necessarily contain one or two hydroxyl groups and contain at least two hydrogen atoms.

3. The photo mask according to claim 1,
wherein said polymer matrix has a condensation polymer of naphthalene derivatives represented by the below general formula (1) with a hydroxymethyl-substituted compound represented by the below general formula (2),
with formula (1) being:

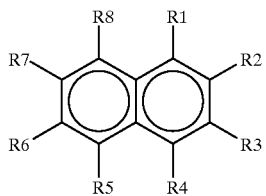
(1)

wherein R1 to R8 each represent an atom or an atomic group selected from the group consisting of a hydroxyl group, hydrogen, an acetyl group substituted or non-substituted with the carbon number of 1 to 4, halogen, a phenyl group, a methoxy group, an ethoxyethyl group, a cyclopropyl group, an acetyl group and a carboxyl group, and R1 to R8 necessarily contain one or two hydroxyl groups and contain at least two hydrogen atoms; and
with formula (2) being:

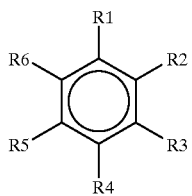
(2)

wherein R1 to R6 each represent an atom or an atomic group selected from the group consisting of a hydroxymethyl group, hydrogen, an alkyl group substituted or non-substituted with the carbon number of 1 to 4, halogen, a hydroxyl group, a phenyl group, a methoxy group, an ethoxyethyl group, a cyclopropyl group and an acetyl group, and R1 to R6 contain at least two hydroxymethyl groups.

4. The photo mask according to claim 1,
wherein said polymer matrix has a condensation polymer of naphthalene derivatives represented by the below general formula (1) with a hydroxymethyl-substituted compound represented by the below general formula (3) or (4),
with formula (1) being:

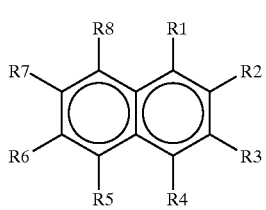
(1)

wherein R1 to R8 each represent an atom or an atomic group selected from the group consisting of a hydroxyl group, hydrogen, an alkyl group substituted or non-substituted with the carbon number of 1 to 4, halogen, a phenyl group, a methoxy group, an ethoxyethyl group, a cyclopropyl group, an acetyl group and a carboxyl group, and R1 to R8 necessarily contain one or two hydroxyl groups and contain at least two hydrogen atoms;
with formula (3) being:

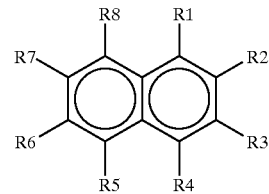
(3)

wherein R1 to R8 each represent an atom or an atomic group selected from the group consisting of a hydroxymethyl group, hydrogen, an alkyl group substituted or non-substituted with the carbon number of 1 to 4, halogen, a hydroxyl group, a phenyl group, a methoxy group, an ethoxyethyl group, a cyclopropyl group and an acetyl group, and R1 to R8 contain at least two hydroxymethyl groups; and
with formula (4) being:

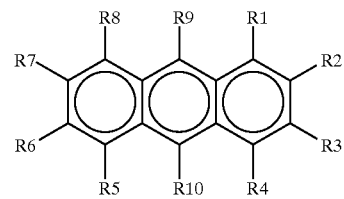
(4)

wherein R1 to R10 each represent an atom or an atomic group selected from the group consisting of a hydroxymethyl group, hydrogen, an alkyl group substituted or non-substituted with the carbon number of 1 to 4, halogen, a hydroxyl group, a phenyl group, a methoxy group, an ethoxyethyl group, a cyclopropyl group and an acetyl group, and R1 to R10 contain at least two hydroxymethyl groups.

5. The photo mask according to claim 1,
wherein said polymer matrix comprises an esterification product of naphthoic acid derivatives represented by the below general formula (5) with a phenolic polymer or a polyphenol compound, and a degree of esterification of said phenolic polymer or polyphenol compound is 30% or more,
with formula (5) being:

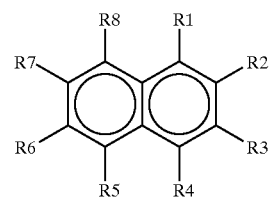
(5)

wherein R1 to R8 each represent an atom or an atomic group selected from the group consisting of a carboxyl group, a hydroxyl group, hydrogen, an alkyl group substituted or non-substituted with the carbon number of 1 to 4, halogen, a phenyl group, a methoxy group, an ethoxyethyl group, a cyclopropyl group and an acetyl group, and R1 to R8 necessarily contain one carboxyl group and contain at least one hydroxyl group.

6. The photo mask according to claim 1, wherein said light shielding film has a transparency relative to KrF excimer laser light of 2–16%.

7. The photo mask according to claim 6, wherein said transparency is 4–9%.

8. A photo mask having a light shielding film, for KrF excimer laser light, of a predetermined pattern, on a photo mask substrate, wherein said light shielding film is formed from a resist film including an aqueous alkali-soluble resin in which a naphthol structure having at least one hydroxyl group bound to a naphthalene nucleus, or a derivative of said aqueous alkali-soluble resin is incorporated, so as to provide in the light shielding film a photo-absorbent structure of KrF excimer laser light, said light shielding film shielding laser light radiating from a KrF excimer laser.

9. The photo mask according to claim 8, wherein said light shielding film has a transparency relative to KrF excimer laser light of 2–16%.

10. The photo mask according to claim 9, wherein said transparency is 4–9%.

11. The photo mask according to claim 8, wherein said light shielding film Is a film formed by exposure and development of said resist film, said resist film being a radiation sensitive resist film.

12. The photo mask according to claim 1, wherein the radiation sensitive resist film is used in forming said light shielding film, by exposing and developing the resist film to form the light shielding film.

13. A method of forming a photo mask having a light shielding film of a predetermined pattern, comprising:
   forming a radiation sensitive resist film on a photo mask substrate, the radiation sensitive resist film including, as a polymer matrix, an aqueous alkali-soluble resin in which a naphthol structure having at least one hydroxyl group bound to a naphthalene nucleus is incorporated as a photo-absorbent structure of a KrF excimer laser light, or a derivative of said aqueous alkali-soluble resin; and
   forming the predetermined pattern from said radiation sensitive resist film, thereby forming said light shielding film, said light shielding film shielding laser light radiating from a KrF excimer laser.

14. The method according to claim 13, wherein the predetermined pattern is formed by exposure and development of said radiation sensitive resist film.

15. The method according to claim 14, wherein development of said radiation sensitive resist film is conducted using an aqueous alkali solution.

16. The method according to claim 13, wherein said light shielding film formed has a transparency to KrF excimer laser light of 2–16%.

17. The method according to claim 16, wherein said transparency is 4–9%.

18. The method according to claim 13,
   wherein said polymer matrix has a condensation polymer of naphthalene derivatives represented by the below general formula (1) with formaldehyde or hydroxynaphthaldehyde, and
   at least 5% component of said naphthalene derivatives contains two hydroxyl or carboxyl groups as substituents,
   with formula (1) being:

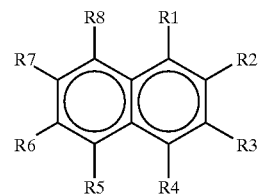

(1)

wherein R1 to R8 each represent an atom or an atomic group selected from the group consisting of a hydroxyl group, hydrogen, an alkyl group substituted or non-substituted with the carbon number of 1 to 4, halogen, a phenyl group, a methoxy group, an ethoxyethyl group, a cyclopropyl group, an acetyl group and a carboxyl group, and R1 to R8 necessarily contain one or two hydroxyl groups and contain at least two hydrogen atoms.

19. The method according to claim 13,
   wherein said polymer matrix has a condensation polymer of naphthalene derivatives represented by the below general formula (1) with a hydroxymethyl-substituted compound represented by the below general formula (2),
   with formula (1) being:

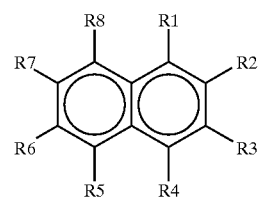

(1)

wherein R1 to R8 each represent an atom or an atomic group selected from the group consisting of a hydroxyl group, hydrogen, an alkyl group substituted or non-substituted with the carbon number of 1 to 4, halogen, a phenyl group, a methoxy group, an ethoxyethyl group, a cyclopropyl group, an acetyl group and a carboxyl group, and R1 to R8 necessarily contain one or two hydroxyl groups and contain at least two hydrogen atoms; and
   with formula (2) being:

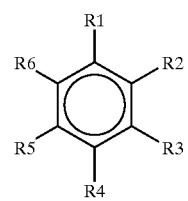

(2)

wherein R1 to R6 each represent an atom or an atomic group selected from the group consisting of a hydroxymethyl group, hydrogen, an alkyl group substituted or non-substituted with the carbon number of 1 to 4, halogen, a hydroxyl group, a phenyl group, a methoxy group, an ethoxyethyl group, a cyclopropyl group and an acetyl group, and R1 to R6 contain at least two hydroxymethyl groups.

20. The method according to claim 13, wherein said polymer matrix has a condensation polymer of naphthalene derivatives represented by the below general formula (1) with a hydroxymethyl-substituted compound represented by the below general formula (3) or (4), with formula (1) being:

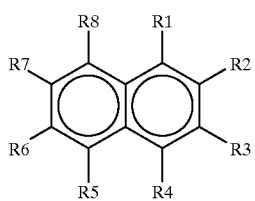

(1)

wherein R1 to R8 each represent an atom or an atomic group selected from the group consisting of a hydroxyl group, hydrogen, an alkyl group substituted or non-substituted with the carbon number of 1 to 4, halogen, a phenyl group, a methoxy group, an ethoxyethyl group, a cyclopropyl group, an acetyl group and a carboxyl group, and R1 to R8 necessarily contain one or two hydroxyl groups and contain at least two hydrogen atoms;

with formula (3) being:

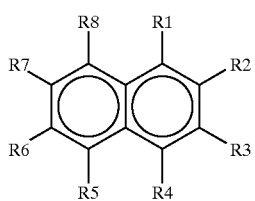

(3)

wherein R1 to R8 each represent an atom or an atomic group selected from the group consisting of a hydroxymethyl group, hydrogen, an alkyl group substituted or non-substituted with the carbon number of 1 to 4, halogen, a hydroxyl group, a phenyl group, a methoxy group, an ethoxyethyl group, a cyclopropyl group and an acetyl group, and R1 to R8 contain at least two hydroxymethyl groups; and with formula (4) being:

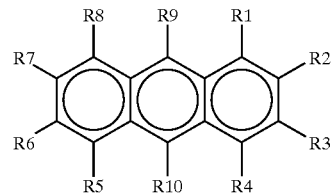

(4)

wherein R1 to R10 each represent an atom or an atomic group selected from the group consisting of a hydroxymethyl group, hydrogen, an alkyl group substituted or non-substituted with the carbon number of 1 to 4, halogen, a hydroxyl group, a phenyl group, a methoxy group, an ethoxyethyl group, a cyclopropyl group and an acetyl group, and R1 to R10 contain at least two hydroxymethyl groups.

21. The method according to claim 13, wherein said polymer matrix comprises an esterification product of naphthoic acid derivatives represented by the below general formula (5) with a phenolic polymer or a polyphenol compound, and a degree of esterification of said phenolic polymer or polyphenol compound is 30% or more, with formula (5) being:

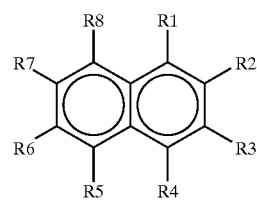

(5)

wherein R1 to R8 each represent an atom or an atomic group selected from the group consisting of a carboxyl group, a hydroxyl group, hydrogen, an alkyl group substituted or non-substituted with the carbon number of 1 to 4, halogen, a phenyl group, a methoxy group, an ethoxyethyl group, a cyclopropyl group and an acetyl group, and R1 to R8 necessarily contain one carboxyl group and contain at least one hydroxyl group.

* * * * *